United States Patent
Ogino et al.

(10) Patent No.: US 11,101,312 B2
(45) Date of Patent: Aug. 24, 2021

(54) SEMICONDUCTOR APPARATUS AND EQUIPMENT

(71) Applicant: CANON KABUSHIKI KAISHA, Tokyo (JP)

(72) Inventors: Takumi Ogino, Koganei (JP); Hiroaki Kobayashi, Kawasaki (JP); Tsutomu Tange, Yokohama (JP); Akihiro Shimizu, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 31 days.

(21) Appl. No.: 16/749,221

(22) Filed: Jan. 22, 2020

(65) Prior Publication Data

US 2020/0251518 A1 Aug. 6, 2020

(30) Foreign Application Priority Data

Jan. 31, 2019 (JP) .............................. JP2019-015822

(51) Int. Cl.
   *H01L 27/146* (2006.01)
   *H01L 23/00* (2006.01)
   *H01L 23/522* (2006.01)

(52) U.S. Cl.
   CPC .... *H01L 27/14634* (2013.01); *H01L 23/5226* (2013.01); *H01L 24/08* (2013.01); *H01L 27/14636* (2013.01); *H01L 2224/08145* (2013.01)

(58) Field of Classification Search
   CPC ......... H01L 27/14634; H01L 27/14636; H01L 27/14627; H01L 27/14683; H01L 27/14621; H01L 24/08; H01L 24/03; H01L 24/04; H01L 24/80; H01L 23/5226; H01L 23/53295; H01L 2224/08145;
   (Continued)

(56) References Cited

U.S. PATENT DOCUMENTS

| 10,068,876 B2 * | 9/2018 | Kabe ....................... H01L 23/58 |
| 2011/0298097 A1 | 12/2011 | Sueyoshi et al. |
| 2013/0076387 A1 | 3/2013 | Ishikawa et al. |

(Continued)

FOREIGN PATENT DOCUMENTS

| JP | 2010-225778 A | 10/2010 |
| JP | 2012256736 A | 12/2012 |

(Continued)

*Primary Examiner* — Dao H Nguyen
(74) *Attorney, Agent, or Firm* — Venable LLP

(57) ABSTRACT

A semiconductor apparatus comprising: a first semiconductor component including a first semiconductor layer and a first insulation film; and a second semiconductor component including a second semiconductor layer and a second insulation film, wherein the first semiconductor component and the second semiconductor component are bonded to each other by each of a plurality of first electric conductor portions provided in the first insulation film and each of a plurality of second electric conductor portions provided in the second insulation film, each of the plurality of first electric conductor portions is constituted by one pad surrounded by the first insulation film and N vias bonded to the one pad so as to be positioned between the one pad and the first semiconductor layer, and a volume VTR of the one pad and a total volume VTH of the N vias satisfy VTR/VTH≥N.

20 Claims, 13 Drawing Sheets

(58) Field of Classification Search
CPC . H01L 2224/08357; H01L 2224/05124; H01L 2224/80986; H01L 2224/8083
USPC .............. 257/459, 431, 432, 443, 622, 762, 257/E27.151, E27.132, E27.133, E23.011, 257/E23.023, E23.068, E21.499, E21.567, 257/E21.577, E21.597, E31.054, E31.11, 257/E31.124, E31.127; 438/60, 69, 107, 438/455, 459
See application file for complete search history.

(56) References Cited

U.S. PATENT DOCUMENTS

| | | |
|---|---|---|
| 2013/0105667 A1 | 5/2013 | Kobayashi |
| 2013/0112849 A1* | 5/2013 | Shimotsusa ............. H01L 24/80 250/206 |
| 2014/0145338 A1* | 5/2014 | Fujii ................ H01L 27/14636 257/762 |
| 2016/0013099 A1 | 1/2016 | Tanida et al. |
| 2018/0096915 A1* | 4/2018 | Fujii .................... H01L 23/522 |
| 2020/0286943 A1* | 9/2020 | Tange ............... H01L 27/14689 |
| 2020/0381469 A1* | 12/2020 | Kanesada ........... H01L 27/1464 |

FOREIGN PATENT DOCUMENTS

| | | |
|---|---|---|
| JP | 2013-125912 A | 6/2013 |
| JP | 2015-041718 A | 3/2015 |
| JP | 2018073851 A | 5/2015 |

* cited by examiner

SEMICONDUCTOR APPARATUS AND EQUIPMENT

BACKGROUND OF THE INVENTION

Field of the Invention

The present technology relates to a semiconductor apparatus and equipment.

Description of the Related Art

Semiconductor apparatuses which have been known are of a type in which a plurality of semiconductor layers are stacked on each other and a plurality of electric conductor portions arranged between the plurality of semiconductor layers are bonded to each other. Japanese Patent Application Laid-open No. 2012-256736 discloses a semiconductor apparatus in which a layer constituting a bonding surface is constituted by an interlayer insulation film and electrode pads that are embedded in the interlayer insulation film and have their surfaces on one side positioned on the same surface as the surface of the interlayer insulation film. In Japanese Patent Application Laid-open No. 2012-256736, vias are connected to the electrode pads, and each of the electrode pads is connected to wiring via each of the vias.

SUMMARY OF THE INVENTION

When the volume of electric conductor portions fluctuates due to the influence of the thermal expansion of the electric conductor portions, stress is caused near the electric conductor portions. Therefore, the reliability of bonding could be low depending on the shape of the electric conductor portions.

Accordingly, the disclosure of the present technology has an object of providing a favorable technology to increase the reliability of the bonding of a plurality of components in a semiconductor apparatus.

A first aspect of the technology of the present disclosure is:

a semiconductor apparatus comprising:

a first semiconductor component including a first semiconductor layer and a first insulation film arranged over the first semiconductor layer; and a second semiconductor component including a second semiconductor layer and a second insulation film arranged over the second semiconductor layer, wherein the first semiconductor component and the second semiconductor component are bonded to each other by 1) each of a plurality of first electric conductor portions arranged in each of a plurality of recessed portions provided in the first insulation film and 2) each of a plurality of second electric conductor portions arranged in each of a plurality of recessed portions provided in the second insulation film, each of the plurality of first electric conductor portions is constituted by 1) one pad surrounded by the first insulation film in a first direction along a principal surface of the first semiconductor layer and 2) N (where N is a natural number of at least two) vias bonded to the one pad so as to be positioned between the one pad and the first semiconductor layer in a second direction perpendicular to the principal surface, and a volume VTR of the one pad and a total volume VTH of the N vias satisfy $$VTR/VTH \geq N.$$

A second aspect of the technology of the present disclosure is:

a semiconductor apparatus comprising:

a first semiconductor component including a first semiconductor layer and a first insulation film arranged over the first semiconductor layer; and a second semiconductor component including a second semiconductor layer and a second insulation film arranged over the second semiconductor layer, wherein the first semiconductor component and the second semiconductor component are bonded to each other by 1) each of a plurality of first electric conductor portions arranged in each of a plurality of recessed portions provided in the first insulation film and 2) each of a plurality of second electric conductor portions arranged in each of a plurality of recessed portions provided in the second insulation film, each of the plurality of first electric conductor portions is constituted by 1) one pad surrounded by the first insulation film in a first direction along a principal surface of the first semiconductor layer and 2) N (where N is a natural number of at least two) vias bonded to the one pad so as to be positioned between the one pad and the first semiconductor layer in a second direction perpendicular to the principal surface, and a volume VTR of the one pad and a volume VSH of at least one of the N vias satisfy $$VTR/VSH \geq N^2.$$

A third aspect of the technology of the present disclosure is:

a semiconductor apparatus comprising:

a first semiconductor component including a first semiconductor layer and a first insulation film arranged over the first semiconductor layer; and a second semiconductor component including a second semiconductor layer and a second insulation film arranged over the second semiconductor layer, wherein the first semiconductor component and the second semiconductor component are bonded to each other by 1) each of a plurality of first electric conductor portions arranged in each of a plurality of recessed portions provided in the first insulation film and 2) each of a plurality of second electric conductor portions arranged in each of a plurality of recessed portions provided in the second insulation film, each of the plurality of first electric conductor portions is constituted by 1) one pad surrounded by the first insulation film in a first direction along a principal surface of the first semiconductor layer and 2) at least one via bonded to the one pad so as to be positioned between the one pad and the first semiconductor layer in a second direction perpendicular to the principal surface, and a volume VTR of the one pad and a volume VSH of one via satisfy $$VTR/VSH \geq 16.$$

According to the disclosure of the present technology, it is possible to provide a favorable technology to increase the reliability of the bonding of a plurality of components in a semiconductor apparatus.

Further features of the present invention will become apparent from the following description of exemplary embodiments with reference to the attached drawings.

DESCRIPTION OF THE EMBODIMENTS

Hereinafter, embodiments for carrying out the present technology will be described with reference to the drawings. Note that in the following descriptions and drawings, common symbols will be added to configurations common throughout a plurality of drawings. Therefore, the common configurations will be described by a cross reference to the plurality of drawings, and the descriptions of the configurations to which the common symbols are added will be omitted where necessary.

First Embodiment

According to the present embodiment, in a semiconductor apparatus APR constituted by two semiconductor components (chips) bonded to each other, the volumes or thicknesses of electric conductor portions of a wiring structure used in the bonding are adjusted to secure the bonding. Specifically, the volumes or thicknesses of vias and pads in the electric conductor portions are adjusted. The thicknesses of the vias or pads indicate the sizes of the vias or pads in a direction (stacked direction) in which a semiconductor layer contained in each of the two semiconductor components is stacked. The stacked direction is a direction perpendicular to the principal surface of the semiconductor layer contained in each of the two semiconductor components. The widths of the vias or pads indicate the sizes of the vias or pads in a direction (plane direction) along the principal surface of the semiconductor layer contained in each of the two semiconductor components.

Outline of Semiconductor Apparatus APR

Figure 1:
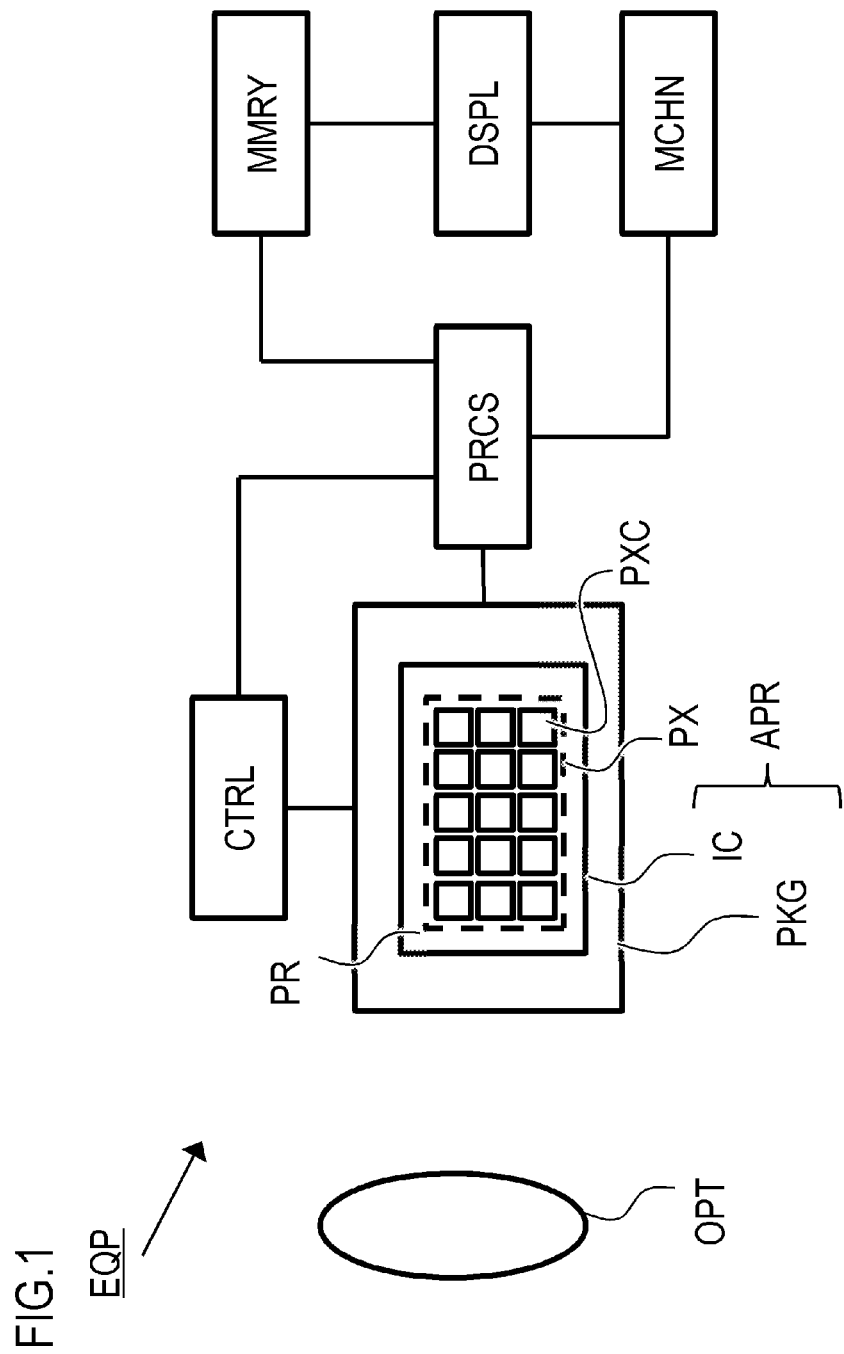
FIG. 1 is a configuration diagram of equipment according to a first embodiment.

First, the outline of the semiconductor apparatus APR will be described below using FIG. 1. FIG. 1 is a schematic view for describing the semiconductor apparatus APR according to the present embodiment.

The semiconductor apparatus APR includes a semiconductor device IC and may contain, besides the semiconductor device IC, a package PKG for installing the semiconductor device IC. In the present embodiment, the semiconductor apparatus APR is a photoelectric converter (solid-state imaging apparatus). The semiconductor device IC has a pixel region PX in which pixel circuits PXC are arrayed in a matrix pattern and a peripheral region PR on the periphery of the pixel region PX. In the peripheral region PR, peripheral circuits may be provided.

Further, the semiconductor apparatus APR is provided in equipment EQP. The equipment EQP can include at least any of an optical system OPT, a controller CTRL, a processor PRCS, a display DSPL, a memory MMRY, and a machine MCHN. The equipment EQP will be described in detail later.

Configuration of Semiconductor Apparatus APR

Figure 2:
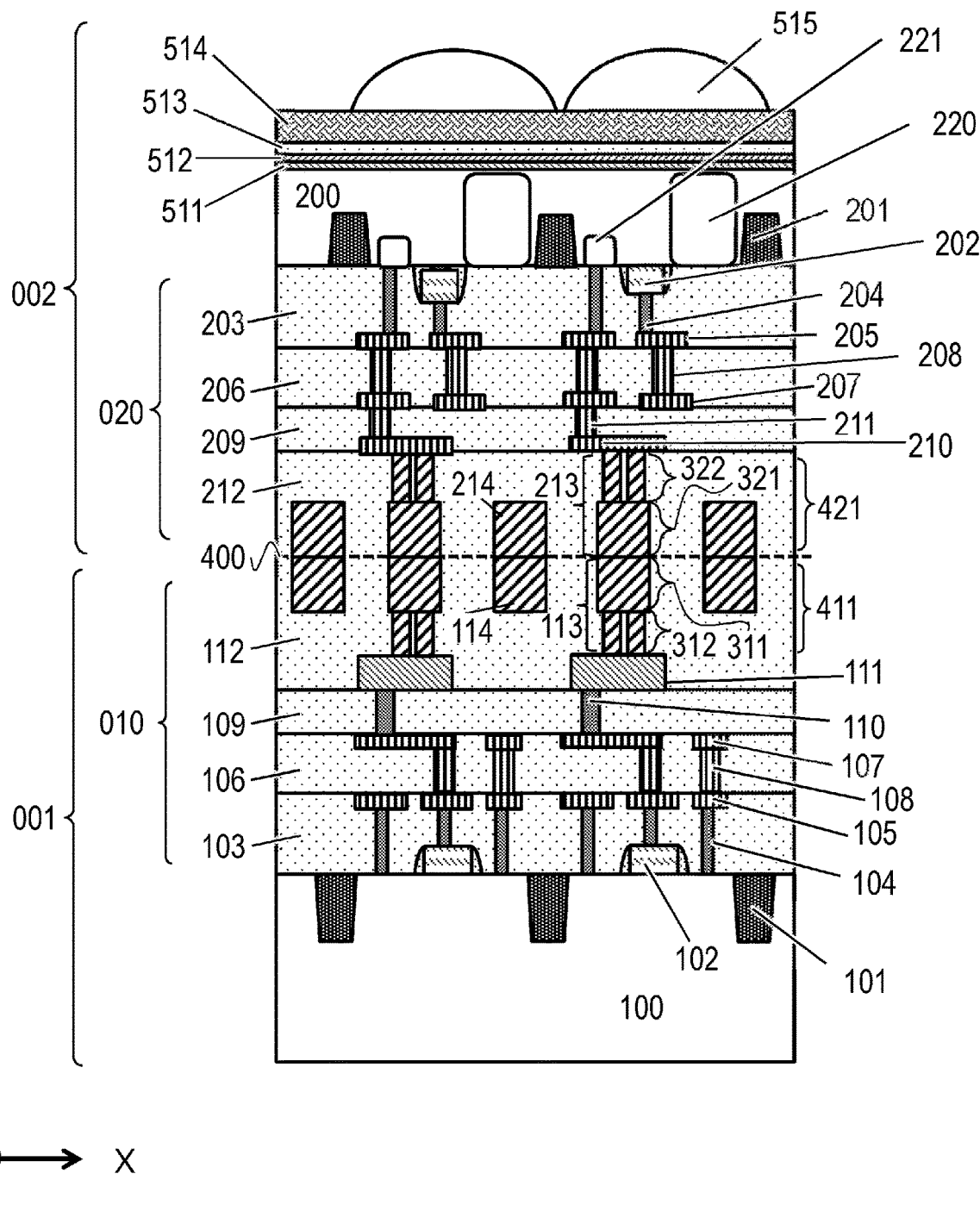
FIG. 2 is a sectional view of a semiconductor apparatus according to the first embodiment.

Next, the configuration of the semiconductor apparatus APR will be described using FIG. 2. FIG. 2 is a sectional view of the semiconductor apparatus APR according to the present embodiment. The semiconductor apparatus APR includes a semiconductor layer 100 and a semiconductor layer 200 stacked on each other. The semiconductor layer 100 and the semiconductor layer 200 are contained in the above semiconductor device IC. A view obtained by cutting off the semiconductor apparatus APR in a direction (Z-axis direction) in which the semiconductor layer 100 and the semiconductor layer 200 are stacked on each other is the sectional view shown in FIG. 2.

The semiconductor apparatus APR includes a wiring structure 010 and a wiring structure 020 arranged between the semiconductor layer 100 and the semiconductor layer 200. A component 001 is a semiconductor component (semiconductor chip) including the semiconductor layer 100 and the wiring structure 010, and a component 002 is a semiconductor component (semiconductor chip) including the semiconductor layer 200 and the wiring structure 020. Each of the wiring structure 010 and the wiring structure 020 has a plurality of wiring layers stacked on each other and a plurality of insulation films stacked on each other as will be described later. For this reason, it can also be said that a portion in which the wiring structure 010 and the wiring structure 020 are bonded to each other is a wiring structure portion in the semiconductor apparatus APR. The semiconductor apparatus APR is constituted by the component 001 and the component 002 bonded to each other.

In the semiconductor apparatus APR, the wiring structure 010 and the wiring structure 020 are bonded to each other. More specifically, the wiring structure 010 and the wiring structure 020 are bonded to each other at a bonding surface 400 constituted by a bonding member 411 of the wiring structure 010 and a bonding member 421 of the wiring structure 020. Note that the bonding surface 400 includes the surface of the bonding member 411 and the surface of the bonding member 421.

Note that in FIG. 2, a direction in which the semiconductor layer 100 and the semiconductor layer 200 are stacked on each other is indicated as a stacked direction Z, and directions orthogonal to the stacked direction Z are indicated as plane directions X and Y. Here, the plane direction X and the plane direction Y are orthogonal to each other. Further, a side on which the semiconductor layer 200 is arranged with respect to the semiconductor layer 100 in a Z-axis direction will be defined as an "upper" side, and a side opposite to the "upper" side in the Z-axis direction will be defined as a "lower" side.

Wiring Structure 010

The wiring structure 010 includes an insulation film 103, contact plugs 104, a wiring layer 105, an insulation film 106, a wiring layer 107, via plugs 108, an insulation film 109, via plugs 110, and a wiring layer 111. Further, the wiring structure 010 includes an insulation film 112 arranged on the wiring layer 111. In addition, the wiring structure 010 includes an insulation film 112 and a plurality of electric conductor portions 113. The bonding member 411 is a part of the wiring structure 010 and includes the insulation film 112 and the plurality of electric conductor portions 113. Typically, the electric conductor portions 113 have a thermal expansion coefficient greater than that of the insulation film 112, and electric conductor portions 213 have a thermal expansion coefficient greater than that of an insulation film 212.

The via plugs 108 connect the wiring layer 105 and the wiring layer 107 to each other.

The via plugs 110 connect the wiring layer 107 and the wiring layer 111 to each other.

The plurality of electric conductor portions 113 have a damascene structure embedded in each of a plurality of recessed portions provided in the insulation film 112 and are used to electrically connect the component 001 to the component 002. The electric conductor portions 113 have a pad 311 and vias 312. The one pad 311 is surrounded by the insulation film 112 in the plane directions X and Y. The one pad 311 has a contour matching the contour of the insulation film 112 surrounding the one pad 311. N (N is a natural number) vias 312 are bonded to the one pad 311 contained in one electric conductor portion 113. In the stacked direction Z, the N vias 312 are positioned between the pad 311 and the semiconductor layer 100. That is, the N vias 312 are positioned in an orthogonal projection from the one pad 311 to the principal surface of the semiconductor layer 100. One via 312 has a width smaller than that of the one pad 311. Each of the N vias 312 is surrounded by the insulation film 112 in the plane directions X and Y. The insulation film 112 exists between the respective N vias 312. The one via 312 has a contour matching the contour of the insulation film 112 surrounding the one via 312. In the present embodiment, the vias 312 preferably have a thickness greater than that of the pad 311. Note that the "thickness" in the present embodiment is a length in the Z-axis direction. Further, the electric conductor portions 113 are connected to the wiring layer 111 constituted by aluminum. More specifically, at least a part of the vias 312 is connected to the wiring layer 111. For example, the pad 311 and the vias 312 of the electric conductor portions 113 have a dual damascene structure and have copper (Cu) as their main ingredient. As shown in FIG. 2, the bonding member 411 may also have electric conductor portions 114 having a single damascene structure that has a pad and does not have vias. As shown in FIG. 2, the bonding member 421 may also have electric conductor portions 214 having a single damascene structure that has a pad and does not have vias. When the electric conductor portions 114 and the electric conductor portions 214 are bonded to each other, the bonding between the component 001 and the component 002 may be more secured.

Note that in order to bond the component 001 and the component 002 to each other and electrically connect the electric conductor portions 113 and the electric conductor portions 213 to each other, it is preferable to perform thermal treatment at about 300° C. to 400° C. However, since the influence of the thermal expansion of the vias 312 increases depending on the volume relationship between the pad 311 and the vias 312 inside the electric conductors during the thermal treatment, there is a concern that the component 001 and the component 002 could separate from each other at a bonding interface. Further, in some manufacturing steps (deposition, etching, and annealing) after the bonding, thermal treatment can be performed at about 100° C. to 400° C. Under the thermal treatment as well, there is a concern that the component 001 and the component 002 could separate from each other at the bonding interface when the influence of the thermal expansion of the vias 312 increases. Further, the semiconductor apparatus APR could be used under, for example, an environment at about 0° C., and the temperature of the semiconductor apparatus APR possibly rises up to about 80° C. due to the heat generation of the semiconductor apparatus APR during use. Therefore, the semiconductor apparatus APR is required to increase durability to such a temperature cycle. The present inventors presume that more excellent bonding is achieved when the volume of the vias 312 is smaller relative to the volume of the pad 311. Further, the present inventors presume that it is effective to reduce the ratio of the volume of the vias 312 to the volume of the pad 311 when there are a greater number of the vias 312 with respect to the one pad 311. This is because the non-uniformity of the volumes inside the electric conductor portions increases with an increase in the number of the vias 312, and the non-uniformity of the volumes inside the electric conductor portions causes a reduction in the reliability of the bonding.

Therefore, in the present embodiment, the pad 311 and the vias 312 are determined such that the volume relationship between the pad 311 and the vias 312 satisfies at least any of the following conditions (relationships) (1) to (3) to perform excellent bonding. Note that the conditions (1) to (3) will be called "excellent bonding conditions" to be described below.

(1) A volume VTR of one pad 311 and a total volume VTH of N (N is a natural number) vias 312 bonded to the one pad 311 satisfy the following relationships.

If N is at least 2, VTR/VTH≥N is satisfied.

If N is 1, VTR/VTH≥2 is satisfied.

Note that an average volume VSH of one via 312 among the N vias 312 is equal to VTH/N. When VSH=VTH/N is substituted into VTR/VTH≥N, VTR/VSH≥$N^2$ is satisfied.

(2) A volume VTR of one pad 311 and a volume VSH of at least one of N (N is a natural number) vias 312 (any one of the N vias 312) bonded to the one pad 311 satisfy the following relationships.

N is at least 2, and VTR/VSH≥$N^2$ is satisfied.

For example, VTR/VSH≥4 is satisfied when N is 2, and VTR/VSH≥16 is satisfied when N is 4.

(3) A volume VTR of one pad 311 and a volume VSH of at least one of N (N is a natural number) vias 312 (any one of the N vias 312) bonded to the one pad 311 satisfy the following relationship.

VTR/VSH≥16 is satisfied.

In this case, N may be 1 or at least 2.

Note that in the cases of the conditions (2) and (3), at least one via 312 among N vias 312 is only required to satisfy the conditions (2) and the conditions (3). This is because reliability may be increased even with one via 312 compared with a case in which all the N vias 312 do not satisfy the conditions (2) and the conditions (3). Of course, it is preferable that all the N vias 312 satisfy the conditions (2) and the conditions (3).

When the excellent bonding conditions are satisfied as described above, the influence of the thermal expansion of the electric conductors caused when the component 001 and the component 002 are bonded to each other, particularly the influence of the thermal expansion of the vias may be prevented. Accordingly, a reduction in the reliability of the bonding due to the separation of the component 001 and the component 002 at the bonding interface may be prevented. The above excellent bonding conditions are more effective when the vias 312 of the electric conductor portions 113 have a thickness greater than that of the pad 311 of the electric conductor portions 113. This is because influence on the bonding due to the expansion of the electric conductor portions 113 and the electric conductor portions 213 is caused when the size (thickness) of the vias 312 in the stacked direction is greater than the size (width) of the vias 312 in a plane direction. Since the reliability reduces if the number of the vias 312 extremely increases as described above, the upper limit of the number (N) of the vias 312 can be 6 (N=6). That is, as for the conditions (1), VTR/VTH≤6 can be satisfied, and N×VTR/VTH≤36 can be satisfied. As for the conditions (2) and (3), VTR/VSH≤36 can be satisfied. Note that although FIG. 2 shows the existence of the electric conductor portions 114 having no vias in the bonding member 411 besides the electric conductor portions 113 having the vias 312, electric conductor portions (not shown) having vias the number of which is greater than that of the electric conductor portions 113 may exist. The number of the vias in such electric conductor portions having a greater number of the vias may exceed N and may not satisfy the above conditions (1) to (3). However, in order to increase the reliability of the bonding between the component 001 and the component 002 in the semiconductor apparatus APR, the electric conductor portions having the vias the number of which is greater than that of the electric conductor portions 113 are preferably smaller in number than the electric conductor portions 113.

As described above, the separation of the component 001 and the component 002 at the bonding interface due to the influence of the thermal expansion of the electric conductor portions is prevented by the establishment of the excellent bonding conditions. Thus, the reliability of the bonding of the semiconductor apparatus APR may be increased.

Wiring Structure 020

The wiring structure 020 includes an insulation film 203, contact plugs 204, a wiring layer 205, an insulation film 206, a wiring layer 207, via plugs 208, an insulation film 209, a wiring layer 210, and via plugs 211. In addition, the wiring structure 020 includes an insulation film 212 and electric conductor portions 213. The bonding member 421 is a part of the wiring structure 020 and includes the insulation film 212 and the plurality of electric conductor portions 213.

The via plugs 208 connect the wiring layer 205 and the wiring layer 207 to each other. The via plugs 211 connect the wiring layer 207 and the wiring layer 210 to each other.

The electric conductor portions 213 have a damascene structure embedded in each of recessed portions provided in the insulation film 212. At least a part of the electric conductor portions 213 is connected to the wiring layer 210. According to the present embodiment, the electric conductor portions 213 have a dual damascene structure and are constituted by a pad 321 and vias 322. The component 001 and the component 002 are electrically connected to each other by the electric conductor portions 113 and the electric conductor portions 213.

Note that at least one of the electric conductor portions 113 of the component 001 and the electric conductor portions 213 of the component 002 is only required to satisfy the above excellent bonding conditions of the thickness and volume between the pad and the vias. Thus, the separation of the component 001 and the component 002 at the bonding surface due to the influence of the thermal expansion of the electric conductor portions 113 or the electric conductor portions 213 may be prevented in thermal treatment during manufacturing or at a temperature rise during use. Accordingly, the reliability of the bonding of the semiconductor apparatus APR may be increased. Note that the electric conductor portions having the vias and the pad exist in four spots in the semiconductor apparatus APR shown in FIG. 2. However, if the above excellent bonding conditions are satisfied even in one of the spots, reliability at bonding portions in the semiconductor apparatus APR may be increased. Note that the reliability at the bonding portions in the semiconductor apparatus APR is more increased if the excellent bonding conditions are satisfied in more spots.

Note that the electric conductor portions 113 and 213 preferably have copper as their main ingredient but may have other ingredients. The electric conductor portions 113 and 213 may have gold or silver as their main ingredient. The insulation films 112 and 212 preferably have a silicon compound as their main ingredient. Further, the insulation films 112 and 212 may have a plural-layer configuration made of a plurality of materials like a film structure in which a layer (for example, a silicon nitride layer) for preventing metal dispersion and a silicon oxide layer or a low-k material layer are stacked on each other. Thus, the influence of metal dispersion resulting from the misalignment of the bonding between the electric conductor portions 113 and 213 resulting from the misalignment of the bonding between the component 001 and the component 002 may be prevented. Note that the insulation films 112 and 212 may have a resin as their main ingredient.

Semiconductor Layer 100

The semiconductor layer 100 is provided with element isolations 101 and a plurality of transistors. Among a plurality of surfaces of the semiconductor layer 100, a surface on which the plurality of transistors is provided is the principal surface of the semiconductor layer 100. The principal surface may also be called a front surface, and a surface opposite to the principal surface may also be called a rear surface. Note that in the semiconductor apparatus APR serving as a photoelectric converter, the integrated circuits of the semiconductor layer 100 may contain signal processing circuits such as analog-signal processing circuits, AD conversion circuits, noise-reduction circuits, and digital-signal processing circuits that process a pixel signal. Further, the semiconductor layer 100 may also be called a "substrate" or a "semiconductor substrate."

The element isolations 101 have a shallow trench isolation (STI) structure and define the element regions (active regions) of the semiconductor layer 100. A plurality of transistors 102 can constitute CMOS circuits. The sources and drains of the transistors 102 can have a silicide layer such as cobalt silicide and nickel silicide. The gate electrodes of the transistors 102 can have a silicide layer, a metal layer, and a metal compound layer. The gate insulation films of the transistors 102 can be silicon oxide films, silicon nitride films, or metal oxide films.

Semiconductor Layer 200

The semiconductor layer 200 is provided with element isolations 201, transfer gates 202 (transfer transistors), photodiodes 220, floating diffusions 221, and pixel transistors (not shown). Among the surfaces of the semiconductor layer 200, a surface on which the plurality of transistors is provided is the principal surface of the semiconductor layer 200. The principal surface may also be called a front surface, and a surface opposite to the principal surface may also be called a rear surface. Further, the semiconductor layer 200 may be called a "substrate" or a "semiconductor substrate."

The element isolations 201 have a STI structure and define the element regions (active regions) of the semiconductor layer 200. The transfer gates 202 transfer the charges of the photodiodes 220 to the floating diffusions 221.

Further, the semiconductor layer 200 is provided with pixel circuits PXC that convert charges generated by the photodiodes 220 into a pixel signal. The pixel circuits PXC may contain pixel transistors such as reset transistors, amplification transistors, and selective transistors. A pixel signal corresponding to charges transferred to the floating diffusions 221 is generated by the amplification transistors. The potentials of the floating diffusions 221 are reset to reset potentials by the reset transistors.

Note that in the semiconductor apparatus APR serving as a photoelectric converter, a metal oxide film 511, an anti-reflection film 512, an insulation film 513, a color filter 514, and micro lenses 515 are arranged on the semiconductor layer 200. The insulation film 513 may contain a light-shielding film for forming an OB region made of a metal film such as tungsten or a light-shielding wall for separation to prevent the color mixture of the light of each pixel. The semiconductor apparatus APR of the present example is a rear-surface irradiation CMOS image sensor in which the rear surface of the semiconductor layer 200 serves as a light-receiving surface. However, the semiconductor apparatus APR to which the present technology is applicable is not limited to an image sensor.

Details of Bonding Between Wiring Structures

Hereinafter, the details of the bonding between the wiring structure 010 of the component 001 and the wiring structure 020 of the component 002 will be described.

Figure 3A:
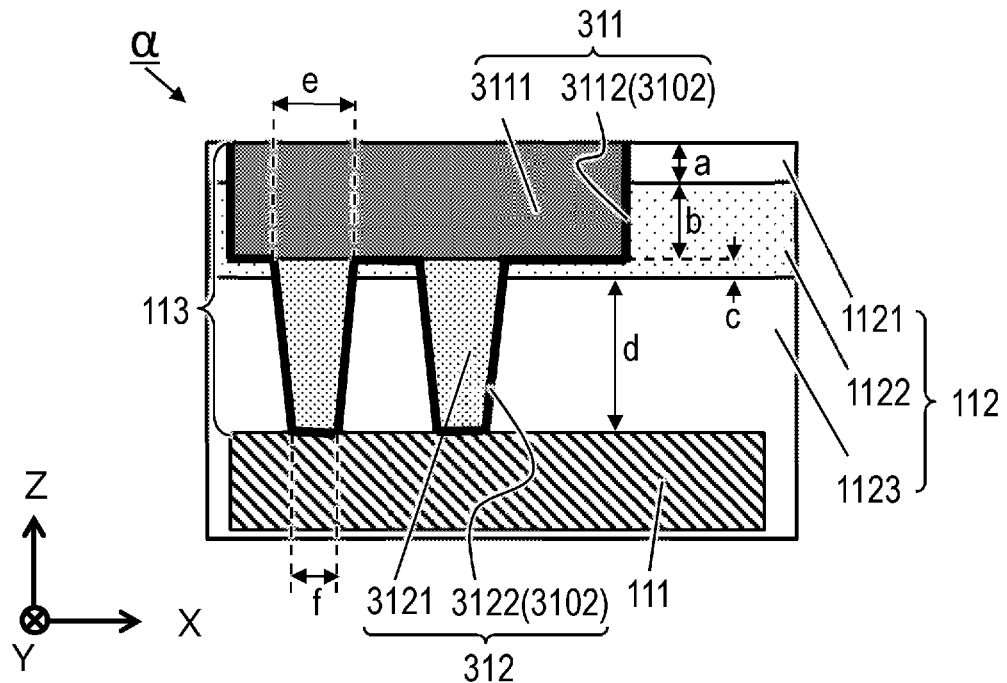
FIGS. 3A and 3B are views showing a component according to the first embodiment.
Figure 3B:
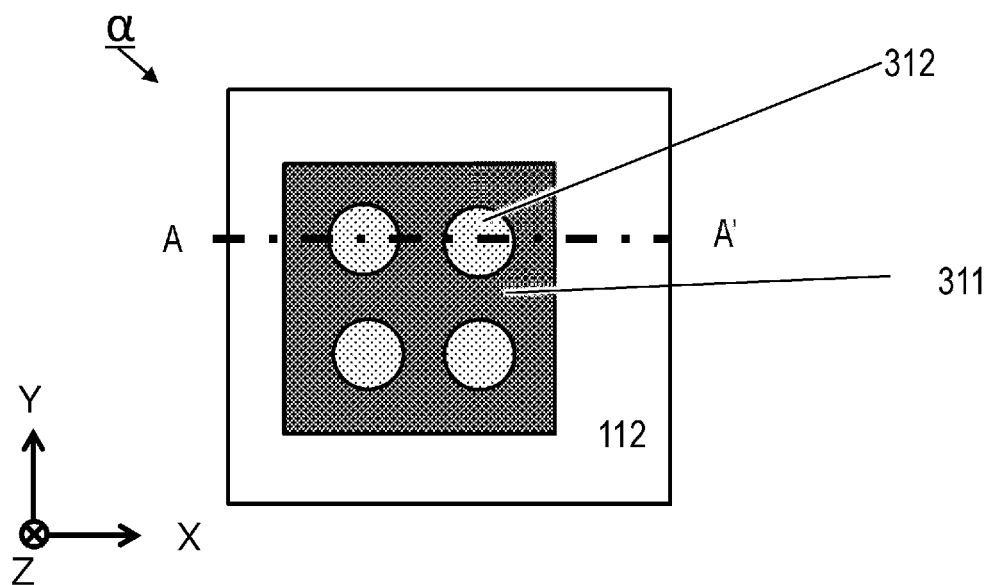
Figure 4:
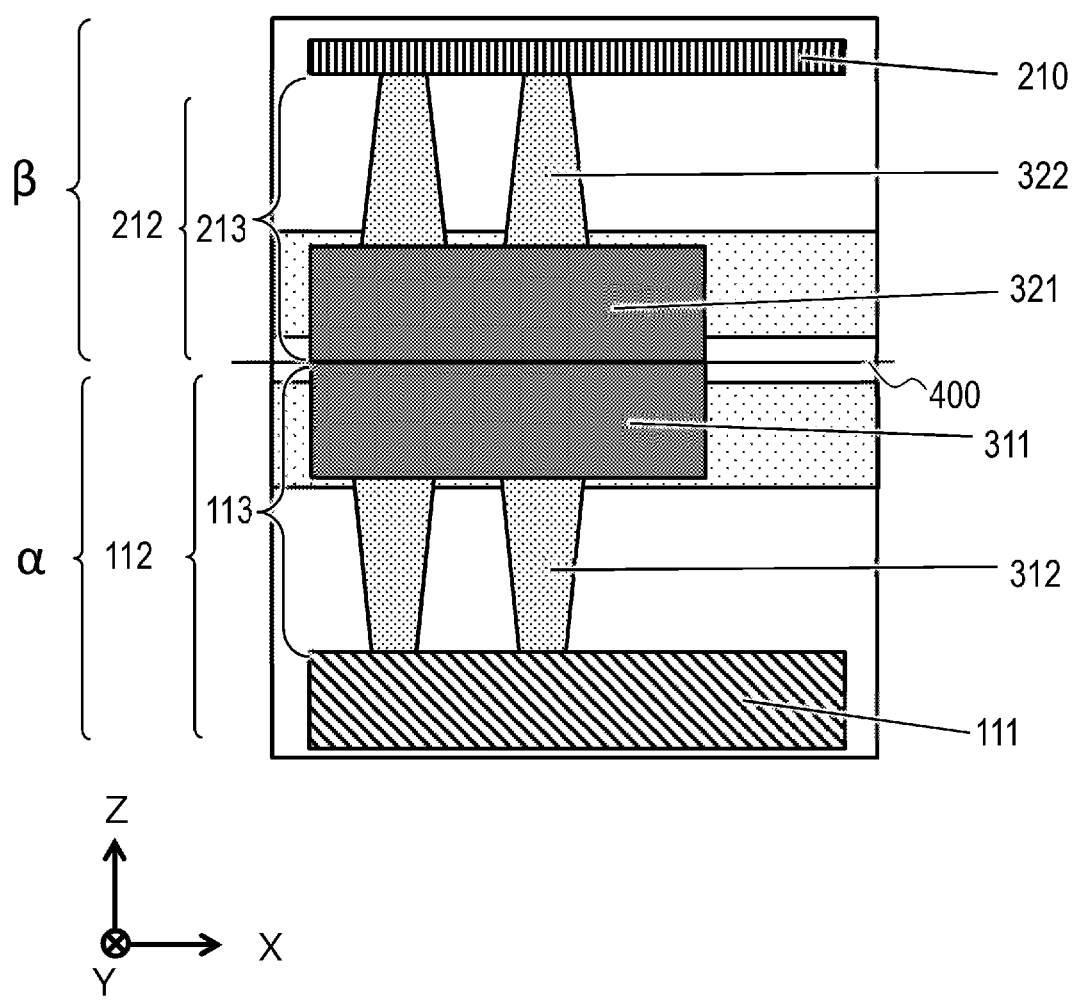
FIG. 4 is a sectional view of a part of the semiconductor apparatus according to the first embodiment.

FIG. 3A is a sectional view of the semiconductor apparatus APR before the bonding according to the present embodiment. More specifically, FIG. 3A is a view showing a bonding portion α that is a part of the wiring structure 010 (bonding member 411) of the component 001. In the bonding member 411, the bonding portions α are provided at a plurality of positions. Further, FIG. 3B shows a plan view (perspective view) of FIG. 3A. FIG. 4 is a sectional view of the semiconductor apparatus APR after the bonding. More specifically, FIG. 4 is a view showing a state in which the bonding portion α and a bonding portion β that is a part of the wiring structure 020 (bonding member 421) of the component 002 are bonded to each other. In the bonding member 421, the bonding portions β are provided at a plurality of positions.

Note that in FIG. 3A to FIG. 4, a direction in which the wiring structure 010 and the wiring structure 020 are stacked on each other is indicated as a stacked direction Z, and directions orthogonal to the stacked direction Z are indicated as orthogonal directions X and Y. The orthogonal direction X and the orthogonal direction Y are orthogonal to each other. Further, a side on which the wiring structure 020 is arranged with respect to the wiring structure 010 in a Z-axis direction will be defined as an "upper" side, and a side opposite to the "upper" side in the Z-axis direction will be defined as a "lower" side below.

As shown in FIG. 3A, the bonding portion α has the wiring layer 111, the insulation film 112, and the electric conductor portions 113. Note that as described using FIG. 2, the component 001 is provided with semiconductor elements such as transistors, a plurality of wiring layers are provided on the semiconductor elements, and the uppermost part of the plurality of wiring layers is the wiring layer 111. Further, the electric conductor portions 113 are connected to the wiring layer 111 to be formed. The electric conductor portions 113 have the pad 311 and the vias 312. For example, the pad 311 and the vias 312 in the electric conductor portions 113 have a dual damascene structure and are made of copper (Cu). Therefore, each of the plurality of electric conductor portions 113 includes a copper region 3111 (copper portion) constituting the pad 311 and having copper as its main ingredient and a copper region 3121 (copper portion) constituting the vias 312 and having copper as its main ingredient. The copper region 3111 continues into the copper region 3121. Further, the pad 311 and the vias 312 have a barrier metal film 3102, which is shown by a thick line surrounding the electric conductor portions 113 in FIG. 3A, at their portions contacting the insulation film 112. The barrier metal film 3102 is made of tantalum (Ta) or a tantalum compound or made of titanium or a titanium compound. The barrier metal film 3102 has a portion 3112 (barrier metal portion) and a portion 3122 (barrier metal portion). The portion 3112 positioned between the copper region 3111 and the insulation film 112. The portion 3122 positioned between the copper region 3121 and the insulation film 112. The portion 3112 continues into the portion 3122. As described above, the pad 311 and the vias 312 have the portions made of copper (Cu) at their portions surrounded by the barrier metal film 3102. Note that the pad 311 has a quadrangular prism shape, and the vias 312 have a truncated cone shape in the present embodiment.

Note that the insulation film 112 is more specifically constituted by the three layers of an insulation layer 1121, an insulation layer 1122, and an insulation layer 1123. The insulation layer 1121 and the insulation layer 1123 are silicon oxide layers mainly constituted by silicon (Si) and oxygen (O), and the insulation layer 1122 is a silicon nitride layer mainly constituted by silicon (Si) and nitrogen (N). The insulation layer 1122 may be a silicon carbide layer mainly constituted by silicon (Si) and carbon (C). Note that the silicon oxide layers may contain an element other than Si, O, and a light element, for example, any of carbon (C), nitrogen (N), fluorine (F), chlorine (Cl), argon (Ar), boron (B), phosphor (P), and sulfur (S) with a concentration lower than those of Si and O. Note that the silicon nitride layer may contain an element other than Si, N, and a light element, for example, any of carbon (C), oxygen (O), fluorine (F), chlorine (Cl), argon (Ar), boron (B), phosphor (P), and sulfur (S) with a concentration lower than those of Si and N. Note that the silicon oxide layer, the silicon nitride layer, and the silicon carbide layer may contain a light element such as hydrogen (H), and the concentration of the light element may be higher or lower than those of Si, O, N, and C. The insulation layer 1122 having a main ingredient different from that of the insulation layer 1121 may serve as an etching stopper when grooves corresponding to the pads 311 are formed by etching. That is, the existence of the insulation layer 1122 makes it possible to form the pads 311 and the vias 312 having an appropriate thickness. The insulation layer 1122 serving as the silicon nitride layer or the silicon carbide layer contained in the insulation film 112 prevents the dispersion of copper contained in the electric conductor portions 213 of the bonding member 421 that is a bonding target into the insulation layer 1123. Similarly, an insulation layer serving as a silicon nitride layer or a silicon carbide layer contained in the insulation film 212 prevents the dispersion of copper contained in the electric conductor portions 113.

Here, as shown in FIG. 3A, the thickness of the insulation layer 1121 is defined as "a", and the thickness of a portion surrounding the pad 311 in the insulation layer 1122 is defined as "b". Further, the thickness of a portion surrounding the vias 312 and overlapping the pad 311 in the insulation layer 1122 is defined as "c", and the thickness of a portion surrounding the vias 312 and overlapping the pad 311 when seen from the stacked direction Z in the insulation layer 1123 is defined as "d". The insulation film 112 may be etched such that "c=0" is satisfied, but is preferably etched such that at least two of "a", "b", "c", and "d" satisfy at least a part of the relationship expressed by "d>b>a≥c". For example, "a<d" may be satisfied, "c<b" may be satisfied, "a<b" may be satisfied, or "c<d" may be satisfied. The insulation layer 1121 has a thickness "a" of, for example, 100 nm to 300 nm, the insulation layer 1122 has a thickness "b+c" of, for example, 300 nm to 500 nm, and the insulation layer 1123 has a thickness "d" of, for example, 400 nm to 800 nm. The thickness "b" is, for example, 200 nm to 400 nm, and the thickness "c" is, for example, 50 nm to 150 nm.

Note that the bonding portion β that is a part of the wiring structure 020 has the wiring layer 210, the insulation film 212, and the electric conductor portions 213. The electric conductor portions 213 have the pad 321 and the vias 322. Further, the insulation film 212 may be constituted by three insulation layers like the insulation film 112.

FIG. 3B shows an example in which four vias 312 connected to a pad 311 exist. Here, in order to bond the bonding portion α (component 001) and the bonding portion β (component 002) to each other and electrically connect the electric conductor portions 113 and the electric conductor portions 213 to each other as shown in FIG. 4, it is required to perform thermal treatment at about 300° C. to 400° C. However, since the influence of the thermal expansion of the volume of the vias increases depending on the volume relationship between the pad and the vias inside the electric conductors during the thermal treatment, there is a concern that the component 001 and the component 002 could separate from each other at a bonding interface. The comparison between the insulation film 112 and the vias 312 below the pad 311 shows that the vias 312 have a thermal expansion coefficient greater than that of the insulation film 112. Therefore, in order to reduce the influence of the thermal expansion below the pad 311, it is effective to reduce the volume of the vias 312 rather than reducing the volume of the insulation film 112 positioned below the pad 311.

Here, it is assumed that the volume of the pad 311 is VTR, and that the volume of the four vias 312 is VTH. Then, the volumes (sizes) of the pad 311 and the vias 312 are determined so as to satisfy the following relationship. Note that VTH and VTR also include the above barrier metal portion. Further, the vias 312 may have a thickness greater than that of the pad 311.

VTR/VTH≥4 (the number of the vias 312)

Thus, the influence of the thermal expansion of the electric conductors caused when the bonding portion α and the bonding portion β are bonded to each other, particularly a reduction in the reliability of the bonding caused when the component 001 and the component 002 separate from each other at the bonding interface due to the influence of the thermal expansion of the vias 312 may be prevented.

The more details of the volume relationship between the pad 311 and the vias 312 to perform excellent bonding will be described below. That is, the following "excellent bonding conditions" are required to be satisfied when N (N is a natural number) vias 312 are connected to one pad 311. Note that the vias 312 have a thickness greater than that of the pad 311. A volume VTR of the pad 311, a total volume VTH of the N vias 312, and a volume VSH of at least one of the N (N is a natural number) vias 312 connected to the one pad 311 preferably satisfy any of the following relationships.

N is at least 2, and VTR/VTH≥N is satisfied.
N is 1, and VTR/VTH≥2 is satisfied.
N is at least 2, and VTR/VSH≥N² is satisfied.
VTR/VSH≥16 is satisfied regardless of N.

Note that N≤6 may be satisfied, N×VTR/VSH≤36 may be satisfied, or VTR/VSH≤36 may be satisfied regardless of the above four relationships. At least two of these relationships may be satisfied. For example, N²≤VTR/VSH≤36 may be satisfied.

Figure 5A:
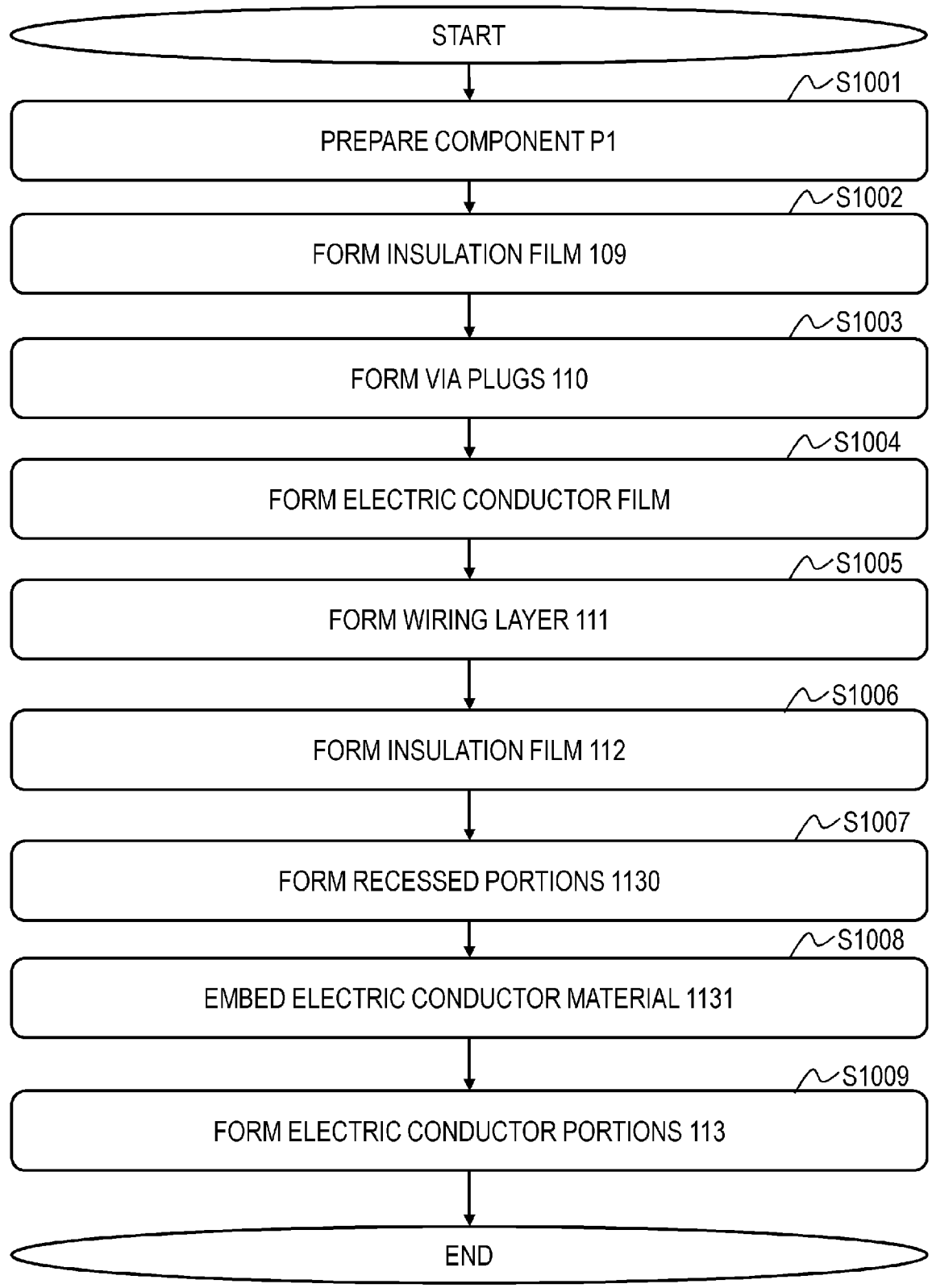
FIGS. 5A to 5C are flowcharts showing a method for manufacturing the semiconductor apparatus according to the first embodiment.
Figure 5B:
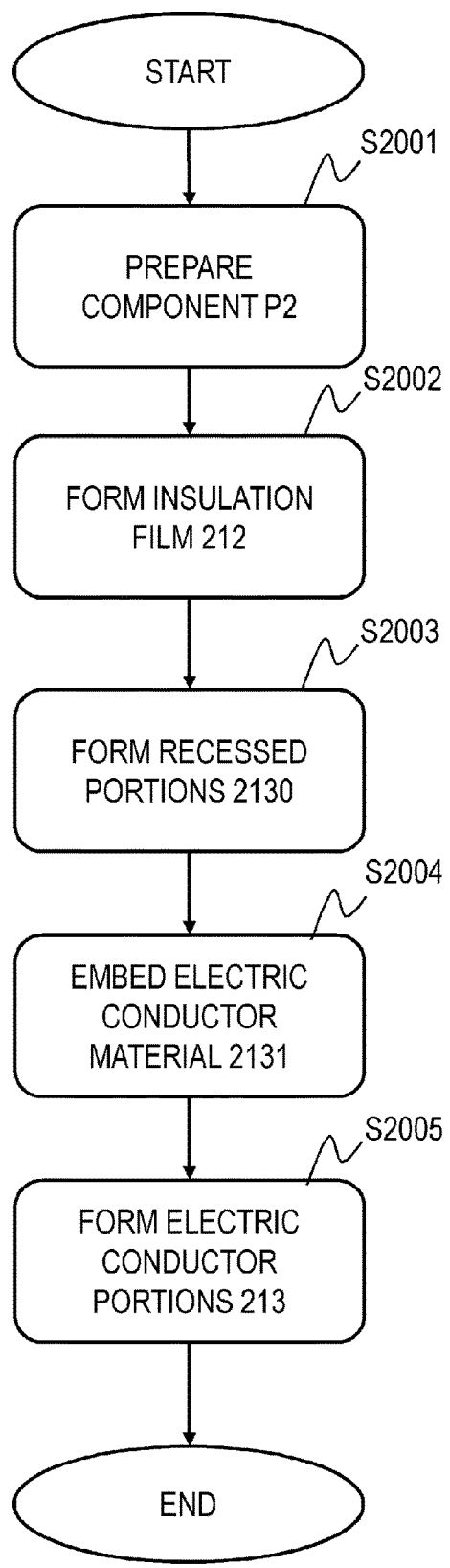

Further, the pad 311 and the vias 312 satisfying the above excellent bonding conditions will be described as an example using specific numeric values. The pad 311 has a thickness of 0.4 μm to 0.6 μm and has, for example, a thickness of 0.5 μm. The vias 312 have a thickness of 0.7 μm to 0.9 μm and have, for example, a thickness of 0.8 μm. Note that in FIG. 5A, the pad 311 has a thickness of "a+b", and that the vias 312 have a thickness of "c+d" as described above. Further, the vias 312 have a width "e" of 0.6 μm to 0.8 μm at their portions contacting the pad 311 and have, for example, a width "e" of 0.7 μm. The vias 312 have a width "f" of 0.3 μm to 0.5 μm at their portions contacting the wiring layer 111 and have, for example, a width "f" of 0.4 μm. Here, the width indicates a length in an X-axis direction or a Y-axis direction. In addition, the pad 311 has a volume VTR of 4.1 μm² to 5.1 μm² and has, for example, a volume VTR of 4.6 μm². Further, the vias 312 include four vias, each of which has a volume (VSH or VTH/N) of 0.1 μm² to 0.3 μm² and has, for example, a volume of 0.2 μm². The four vias 312 have a total volume VTH of 0.7 μm² to 0.9 μm² and have, for example, a total volume VTH of 0.8 μm².

It is simply assumed that the vias 312 have a thickness of 0.8 μm, the vias 312 (electric conductor portions 113) have a thermal expansion coefficient of 17×10⁻⁶/K, and the insulation film 112 has a thermal expansion coefficient of 1×10⁻⁶/K. If the temperature of the bonding member 411 changes by 100 K there could be a difference in thickness between the portion of the vias 312 and the portion of the insulation film 112 by about 1.3 nm below the pad 311. When it is considered to flatten the bonded surface of the bonding member to make its difference of elevation be not more than 10 nm, a difference of about several nanometers is not negligible. It is presumed that the difference in the thickness could cause stress and reduce the reliability of the bonding.

When the above excellent bonding conditions are satisfied, the separation of the component 001 and the component 002 at the bonding interface due to the influence of the thermal expansion of the electric conductors may be prevented during thermal treatment for firmly bonding wafers to each other. The thermal expansion of the electric conductor portions 113 mainly constituted by copper becomes unstable with an increase in the number or the volume of the vias 312. On the other hand, the thermal expansion of the electric conductor portions 113 becomes stable with an increase in the volume of the pad 311. Therefore, a possibility that causes trouble in the semiconductor apparatus APR may be reduced, and the reliability of the bonding of the semiconductor apparatus APR may be increased.

Note that the excellent bonding conditions are satisfied by the pad 311 and the vias 312 in the bonding portion α in the present embodiment but may be satisfied in other ways. That is, the excellent bonding conditions are not satisfied in the bonding portion α but may be satisfied by the pad 321 and the vias 322 in the bonding portion β. That is, the above excellent bonding conditions are only required to be satisfied by the pad and the vias for use in the bonding in any of the bonding portion α and the bonding portion β. That is, at least any of the above conditions (1) to (3) is only required to be satisfied when the volume of one pad 321 is VTR, the total volume of N vias 322 is VTH, and the volume of one via 322 is VSH. Note that the number of the vias 312 in the electric conductor portions 113 and the number of the vias 322 in the electric conductor portions 213 may be different in the relationship between the electric conductor portions 113 and the electric conductor portions 213 bonded to each other. When one of the number of the vias 312 and the number of the vias 322 is expressed as N (N vias), the other of the number of the vias 312 and the number of the vias 322 may be expressed as M (M vias). M is applicable to the above conditions (1) to (3) as a variable equivalent to N. Note that the pads 311 and 321 may also be called pad portions, and that the vias 312 and 322 may also be called via portions. When the pads 311 and 321 having the volume VTR are called the pad portions, the volumes of the pad portions may be expressed as VTRP (volume VTRP) (VTR=VTRP). Further, when the vias 312 and 322 having the volumes VTH and VSH, respectively, are called the via portions, the volumes of the via portions may be expressed as VTHP (volume VTHP) and VSHP, respectively (VTH=VTHP, VSH=VSHP). For example, one of the electric conductor portions 113 and the electric conductor portions 213 is only required to satisfy VTRP/VTHP≥N (satisfy VTR/VTH≥N), and the other of the electric conductor portions 113 and the electric conductor portions 213 is only required to satisfy VTRP/VTHP≥M.

Further, the electric conductor portions 113 and the electric conductor portions 213 may be or may not be symmetrical with respect to a plane on the basis of the bonding surface 400. Further, the pad 311 has a quadrangular prism shape, and the vias 312 have a truncated cone shape in the present embodiment. However, the pad 311 and the vias 312 may have other shapes. Specifically, the pad 311 and the vias 312 may have various shapes such as a cylindrical shape, a truncated cone shape, a quadrangular prism shape, and a truncated quadrangular prism shape.

Method for Forming Portions Related to Bonding in Semiconductor Apparatus APR

Next, a method for manufacturing the portions shown in FIG. 4 in the semiconductor apparatus APR according to the present embodiment will be described. That is, a method for manufacturing the portions related to the bonding between the component 001 and the component 002 in the semiconductor apparatus APR according to the present embodiment will be described.

Method for Forming Bonding Portion α

First, a bonding portion α is formed in the following manufacturing steps of S11 to S13.

(S11) Semiconductor elements such as transistors are formed on a semiconductor layer 100, and a plurality of wiring layers are formed on the semiconductor elements. The uppermost part of the plurality of wiring layers is a wiring layer 111.

(S12) An insulation film 112 is formed on the wiring layer 111.

(S13) Electric conduction portions 113 are formed using a method for manufacturing a general dual damascene. Pads 311 and vias 312 are formed by patterns defined by photomasks.

Specifically, in S13, grooves are formed by etching and then embedded with electric conductors such as copper over the entire area by PVD or CVD. Note that in the present embodiment, only the surfaces of the grooves may be coated with barrier metal made of tantalum or a tantalum compound before the grooves are embedded with copper, and then the grooves may be embedded with electric conductors such as copper. Then, the electric conductors on the surfaces are removed by chemical mechanical polishing or etch back to form the electric conductor portions 113. As a result, the bonding portion α before bonding as shown in FIG. 3A is completed.

Note that in S13, the pad 311 is formed to have an opening area STR and a thickness HTR by a pattern defined by a photomask. Further, the vias 312 are formed to have an opening area STH and a thickness HTH by a pattern defined by a photomask. Accordingly, a volume VTR of the pad 311 is calculated by the product of the opening area STR of the mask of a pad portion and the thickness HTR of the pad 311. Further, a total volume VTH of N vias connected to the pad is calculated by the product of the opening area STH of the mask of via portions, a thickness HTH of the vias, and the number N of the vias. Note that the thickness HTH of the vias 312 is formed to be greater than the thickness HTR of the pad 311.

Further, the electric conductor portions 113 are formed such that any of the following relationships is satisfied between the volume VTR of the pad 311, the total volume VTH of the N (N is a natural number) vias 312 connected to the pad 311, and a volume VSH of any one of the N vias 312.

N is at least 2, and VTR/VTH≥N is satisfied.
N is 1, and VTR/VTH≥2 is satisfied.
N is at least 2, and VTR/VSH≥$N^2$ is satisfied.
VTR/VSH≥16 is satisfied regardless of N.

Note that N≤6 may be satisfied, N×VTR/VSH≤36 may be satisfied, or VTR/VSH≤36 may be satisfied regardless of the above relationships. At least two of these relationships may be satisfied. For example, $N^2$≤VTR/VSH≤36 may be satisfied.

Method for Forming Bonding Portion β

Next, a bonding portion β is formed in the following manufacturing steps of S21 to S23.

(S21) Semiconductor elements such as transistors are formed on a semiconductor layer 200, and a plurality of wiring layers are formed on the semiconductor elements. The uppermost part of the plurality of wiring layers is a wiring layer 210.

(S22) An insulation film 212 is formed on the wiring layer 210.

(S23) Electric conduction portions 213 are formed using a method for manufacturing a general dual damascene.

More specifically, in S23, grooves are formed by etching and then embedded with electric conductors such as copper over the entire area of the surface by PVD or CVD. Then, the electric conductors on the surface are removed by chemical mechanical polishing or etch back. As a result, the bonding portion β before bonding is completed.

Note that in S23, a pad 321 and vias 322 of the electric conductor portions 213 of the bonding portion β are also preferably formed so as to satisfy the above excellent bonding conditions.

Bonding of Two Semiconductor Wafers

Next, the bonding portion β manufactured in S23 is inverted, and the bonding portion α and the bonding portion β are bonded to each other at a bonding surface 400. Thus, a part of the semiconductor apparatus APR shown in FIG. 4 having a structure in which the bonding portion β is stacked on the bonding portion α may be manufactured after the bonding.

Note that wafers are first tentatively bonded to each other by, for example, plasma activation bonding method. After that, thermal treatment is performed to add heat at 350° C., whereby the insulation film 112 and the insulation film 212 are bonded to each other and the electric conductor portions 113 and the electric conductor portions 213 are bonded to each other. At least one of the bonding portion α and the bonding portion β is set to satisfy the above excellent bonding conditions of the volumes of the pad and the vias. The bonding between the insulation film 112 and the insulation film 212 may be realized by chemical bonding such as an intermolecular force and covalent bonding, integration by the melting of the insulation film 112 and the insulation film 212, bonding through an adhesive, or the like. Note that the insulation film 112 and the insulation film 212 may separate from each other. The bonding between the electric conductor portions 113 and the electric conductor portions 213 may be realized by metal bonding.

Thus, the separation of the bonding portion α and the bonding portion β at the bonding interface due to the influence of the thermal expansion of the electric conductor portions 113 or the electric conductor portions 213 may be prevented during thermal treatment for firmly bonding the bonding portion α and the bonding portion β to each other. Accordingly, the reliability of the bonding portions of the semiconductor apparatus APR may be increased.

Next, a method for manufacturing a semiconductor apparatus APR will be described. Hereinafter, after the descriptions of a method for manufacturing a wafer for a component 001 and a method for manufacturing a wafer for a component 002, a method for manufacturing the semiconductor apparatus APR using the two wafers will be described.

Method for Manufacturing Semiconductor Wafer for Component 001

First, the method for manufacturing the semiconductor wafer for the component 001 will be described using a flowchart shown in FIG. 5A, FIGS. 6A and 6B, and FIGS. 7A and 7B.

S1001

Figure 6A:
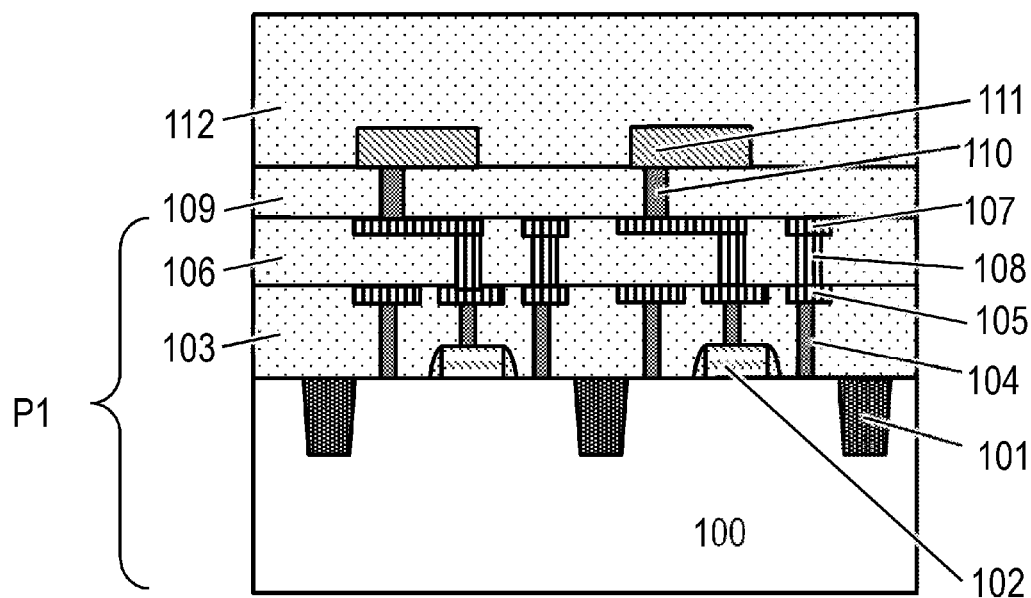
FIGS. 6A and 6B are views showing steps for manufacturing the component according to the first embodiment.

A wafer P1 that is a part of the semiconductor wafer for the component 001 shown in FIG. 6A is prepared. The wafer P1 has a semiconductor layer 100, element isolations 101, transistors 102 (gate electrodes), an insulation film 103, and contact plugs 104. In addition, the wafer P1 has a wiring layer 105, an insulation film 106, a wiring layer 107, and via plugs 108 that connect the wiring layer 105 and the wiring layer 107 to each other. Note that the description of a method for manufacturing the wafer P1 will be omitted since the wafer P1 may have a known configuration.

S1002

An insulation film 109 is formed on the insulation film 106. The insulation film 109 is, for example, a silicon oxide film, a silicon nitride film, a silicon oxynitriding film, a carbon-containing silicon oxide film, a fluorine-containing silicon oxide film, or the like. Further, the insulation film 109 may have, as its film-layer configuration, a single-layer configuration made of one type of material or a plural-layer configuration made of a plurality of materials.

S1003

Next, grooves are formed on the surface of the insulation film 109 by etching, and electric conductors are formed over the entire area of the surface by PVD or CVD. As a result, the grooves are embedded with the electric conductors. The electric conductors on the surface are removed by chemical mechanical polishing or etch back. As a result, via plugs 110 are formed in the insulation film 109 as shown in FIG. 6A.

S1004

Then, an electric conductor film is formed on the insulation film 109. The material of the electric conductor film can be aluminum or the like.

S1005

Next, the electric conductor film on the insulation film 109 is patterned. The patterning is realized by photolithography and etching. As a result, a wiring layer 111 is formed. Note that although the three layers of the wiring layer 105, the wiring layer 107, and the wiring layer 111 are formed in the present embodiment, it is possible to arbitrarily select the number of wiring layers. Further, although only MOS transistors are arranged on the surface of the semiconductor layer 100 in the present embodiment, other stuffs may also be arranged. For example, it is also possible to arrange, for example, MOS capacitors, trench capacitors, resistors using a part of the semiconductor layer 100, resistors using the transistors 102 (gate electrodes), or the like. Further, it is also possible to arrange MIM capacitors or the like between the wiring layers.

S1006

Then, an insulation film 112 is formed on the insulation film 109. The insulation film 112 is, for example, a silicon oxide film, a silicon nitride film, a silicon oxynitriding film, a carbon-containing silicon oxide film, a fluorine-containing silicon oxide film, or the like. Here, by performing, for example, flattening based on chemical mechanical polishing after the formation of a silicon oxide film, it is possible to reduce trouble resulting from a step in the next and subsequent manufacturing steps.

S1007

Figure 6B:
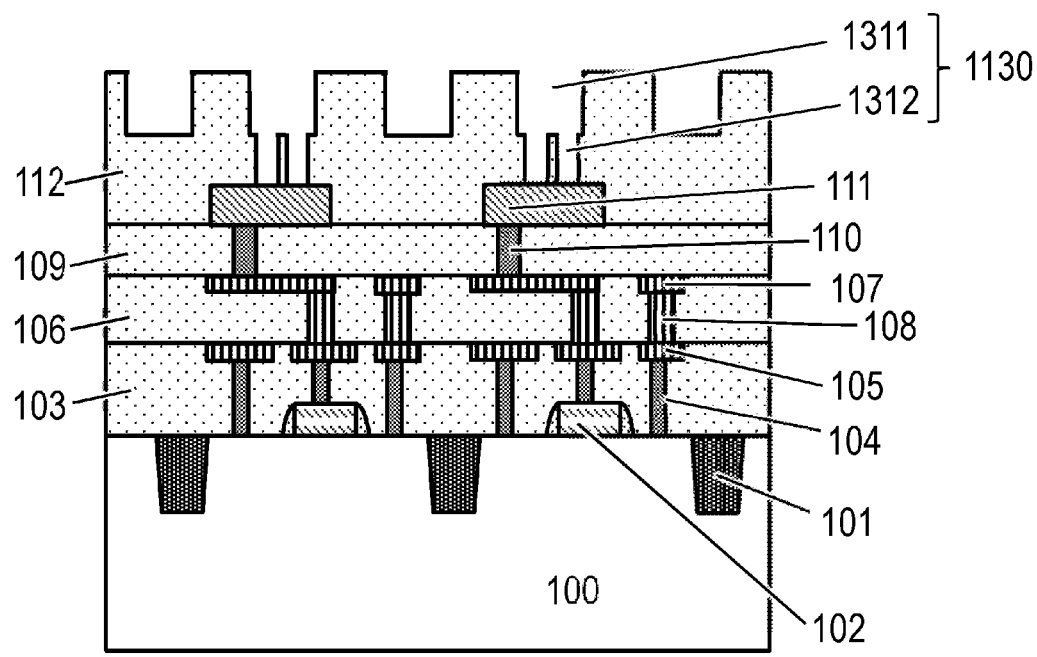

Next, as shown in FIG. 6B, a plurality of recessed portions 1130 for embedding an electric conductor material are formed on the insulation film 112. At least a part of the plurality of recessed portions 1130 is formed so as to reach the wiring layer 111. Note that the recessed portions 1130 are arranged at an appropriate density in the entire chip. The recessed portions 1130 are formed of a groove (trench) 1311 corresponding to a pad 311 and holes (via holes) 1312 corresponding to vias 312 in the recessed portions 1130. In the formation of the recessed portions 1130, an etching method for dual damascene may be used. As a method for forming the recessed portions 1130, any of a via-first method in which the groove 1311 is formed after the formation of the holes 1312, a trench-first method in which the holes 1312 are formed after the formation of the groove 1311, and a method in which the holes 1312 and the groove 1311 are simultaneously formed may be used. In order to increase accuracy in controlling the shape of the vias 312, a resist pattern defined by a photomask corresponding to the groove 1311 is preferably formed after the formation of a resist pattern defined by a photomask corresponding to the holes 1312. Note that as for portions forming recessed portions corresponding to electric conductor portions 114, the recessed portions corresponding to the electric conductor portions 114 are only required to be formed during the formation of the grooves 1311, and the portions are only required to be masked during the formation of the holes 1312.

At this time, the recessed portions 1130 are embedded with an electric conductor material in a subsequent manufacturing step to be formed into electric conductor portions 113. Therefore, the recessed portions 1130 are only required to be formed such that the volumes and thicknesses of the groove (trench) 1311 corresponding to the pad 311 and the holes (through-holes) 1312 corresponding to the vias 312 in the recessed portions 1130 satisfy the following relationships. Note that the holes 1312 preferably have a depth greater than that of the groove 1311. A volume MVTR of a groove 1311, a total volume MVTH of N holes 1312, and a volume MVSH of one hole 1312 satisfy at least any of the following relationships.

N is at least 2, and MVTR/MVTH≥N is satisfied.
N is 1, and MVTR/MVTH≥2 is satisfied.
N is at least 2, and MVTR/MVSH≥$N^2$ is satisfied.
MVTR/MVSH≥16 is satisfied regardless of N.
Note that N≤6 may be satisfied, N×VTR/MVSH≤36 may be satisfied, or MVTR/MVSH≤36 may be satisfied regardless of the above relationships. At least two of these relationships may be satisfied. For example, $N^2 \leq MVTR/MVSH \leq 36$ may be satisfied.

S1008

Figure 7A:
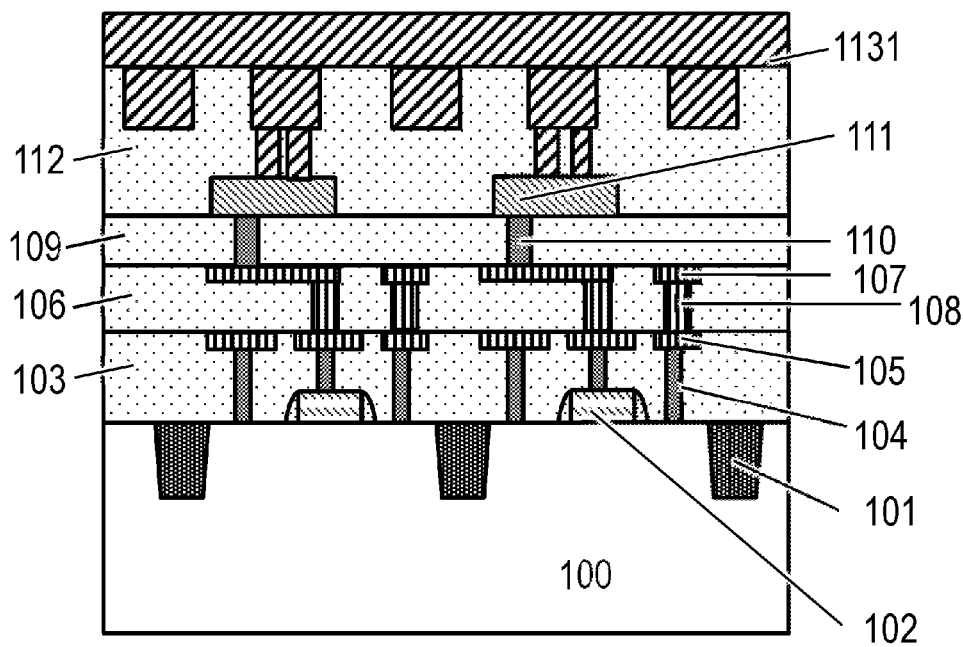
FIGS. 7A and 7B are views showing steps for manufacturing the component according to the first embodiment.

Then, as shown in FIG. 7A, an electric conductor material 1131 is formed over the entire area of the surface of the insulation film 112. At this time, the recessed portions 1130 are embedded with the electric conductor material 1131. The material of the electric conductor material 1131 can be copper.

S1009

Figure 7B:
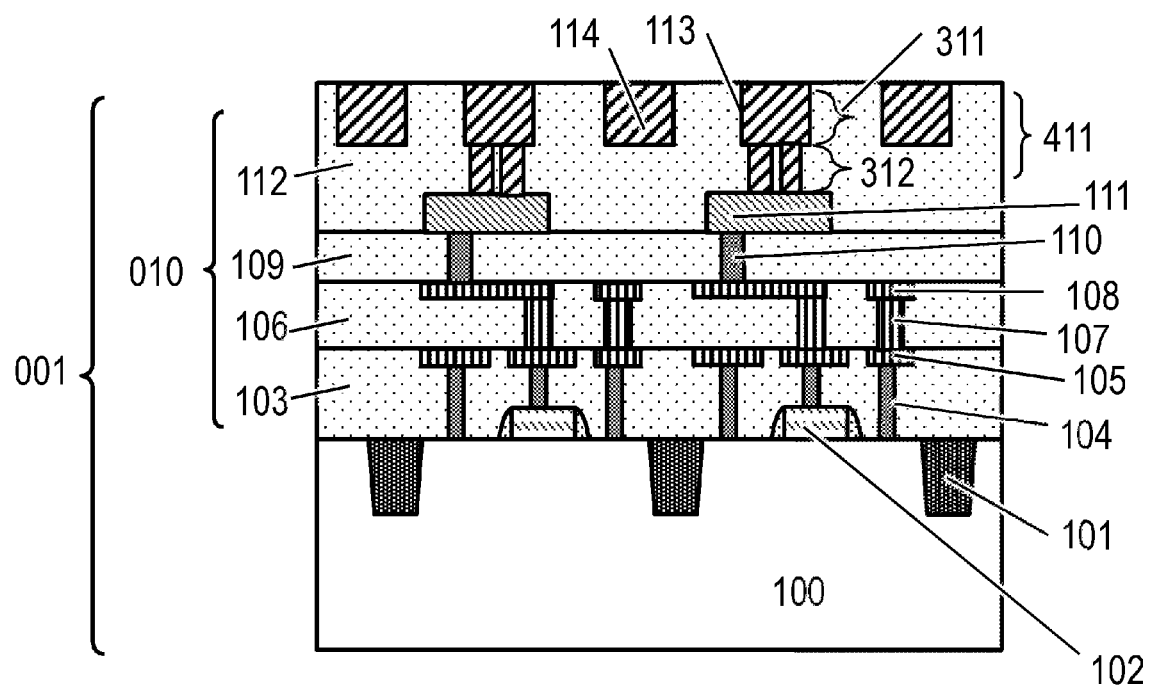

Next, as shown in FIG. 7B, an unnecessary portion of the electric conductor material 1131 is removed by chemical mechanical polishing to form the electric conductor portions 113. That is, the pads 311 and the vias 312 arranged at the bottoms of the pads are formed. If the adjustment of the thicknesses and volumes of the grooves 1311 and the holes 1312 in the recessed portions 1130 has been performed in S1007, the electric conductor portions 113 satisfying the above excellent bonding conditions may be formed. Through the above manufacturing steps, the semiconductor wafer for the component 001 before bonding is completed. Note that since the electric conductor portions 113 are formed at an appropriate density in the entire chip during the chemical mechanical polishing, dishing or erosion due to the chemical mechanical polishing is prevented. Accordingly, the flatness of the surface of the semiconductor wafer for the component 001 before bonding is increased. Trouble resulting from a step when the wafers are bonded to each other may be reduced. The topmost surface of the semiconductor wafer for the component 001 is flattened and can be constituted by the electric conductor portions 113 and the insulation film 112. That is, a distance from the topmost surface of the semiconductor wafer for the component 001 to the electric conductor portions 113 and the insulation film 112 can be zero. However, until the bonding that will be described later is performed, the semiconductor wafer may be stored or shipped in a state in which a coating film for coating the electric conductor portions 113 and the insulation film 112 is formed. The coating film may have a thickness smaller than that of the pads 311, and have, for example, a thickness of not more than 500 nm, a thickness of not more than 50 nm, or a thickness of at least 5 nm. The thickness of the coating film can correspond to the distance from the topmost surface (uppermost surface) of the semiconductor wafer for the component 001 to the electric conductor portions 113 and the insulation film 112. The distance from the topmost surface of the semiconductor wafer for the component 001 to the electric conductor portions 113 and the insulation film 112 may be smaller than the thickness of the pads 311 and is, for example, not more than 500 nm, not more than 50 nm, or at least 5 nm.

Method for Manufacturing Semiconductor Wafer for Component 002

Next, the method for manufacturing the semiconductor wafer for the component 002 will be described using a flowchart shown in FIG. 5B, FIGS. 8A and 8B, and FIGS. 9A and 9B.

S2001

Figure 8A:
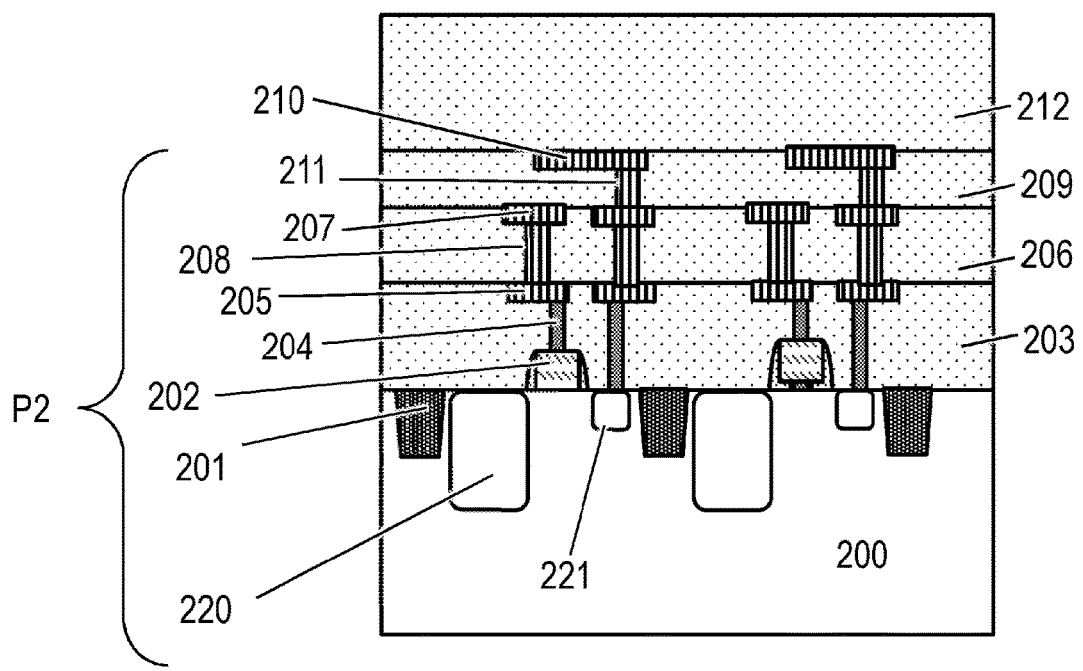
FIGS. 8A and 8B are views showing steps for manufacturing a component according to the first embodiment.

A wafer P2 that is a part of the semiconductor wafer for the component 002 shown in FIG. 8A is prepared. The wafer P2 has a semiconductor layer 200, element isolations 201, transfer gates 202, an insulation film 203, and contact plugs 204. The semiconductor layer 200 is provided with photodiodes 220 and floating diffusions 221. In addition, the wafer P2 has a wiring layer 205, an insulation film 206, a wiring layer 207, and via plugs 208 that connect the wiring layer 205 and the wiring layer 207 to each other. Moreover, the wafer P2 has an insulation film 209, a wiring layer 210, and via plugs 211 that connect the wiring layer 207 and the wiring layer 210 to each other. Note that the description of a method for manufacturing the wafer P2 will be omitted since it is possible to manufacture the wafer P2 according to a known technology.

Further, although only MOS transistors are arranged on the surface of the semiconductor layer 200 in the present embodiment, other stuffs may also be arranged. For example, it is also possible to arrange, for example, MOS capacitors, trench capacitors, resistors using a part of the semiconductor layer 200, resistors using the transfer gates 202, or the like. Further, it is also possible to arrange MIM capacitors or the like between the wiring layers.

S2002

An insulation film 212 is formed on the insulation film 209. The insulation film 212 is, for example, a silicon oxide film, a silicon nitride film, a silicon oxynitriding film, a carbon-containing silicon oxide film, a fluorine-containing silicon oxide film, or the like.

S2003

Figure 8B:
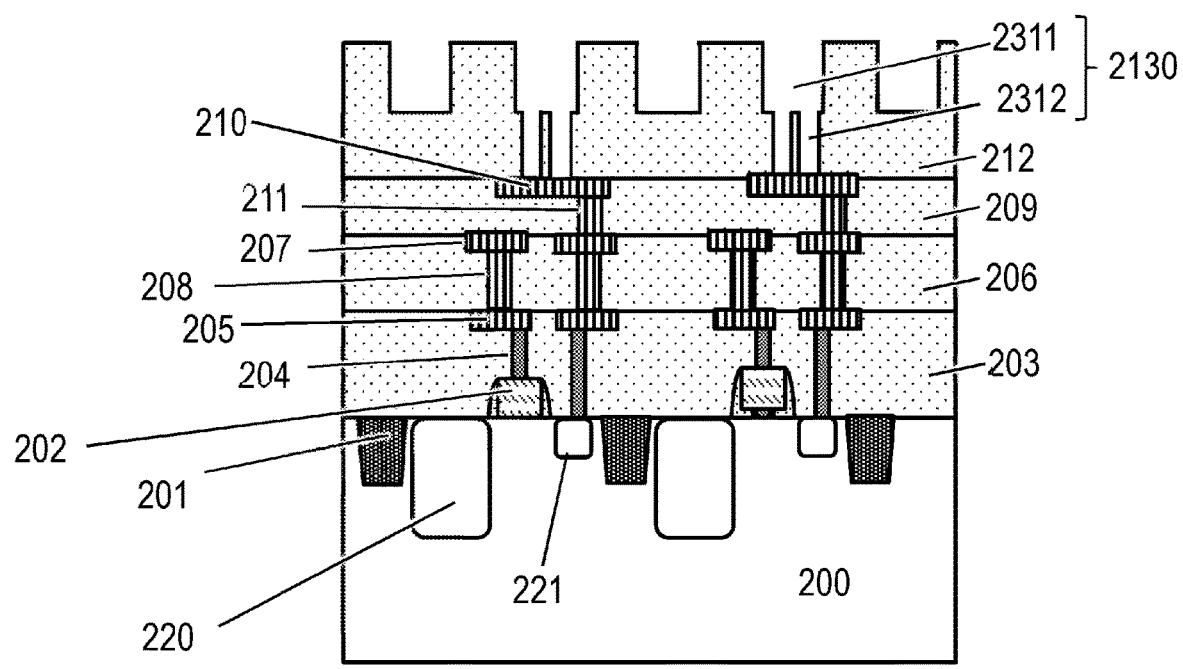

Next, as shown in FIG. 8B, a plurality of recessed portions 2130 for embedding an electric conductor material are formed on the insulation film 212. At least a part of the plurality of recessed portions 2130 is formed so as to reach the wiring layer 210. Note that the recessed portions 2130 are arranged at an appropriate density in the entire chip. Therefore, the volumes and thicknesses of a groove 2321 corresponding to a pad 321 and holes 2322 corresponding to vias 322 in the recessed portions 2130 are only required to satisfy the relationships shown in S1007. The recessed portions 2130 corresponding to the electric conductor portions 213 and recessed portions corresponding to electric conductor portions 214 may be formed by the same method as the method shown in S1007.

S2004

Figure 9A:
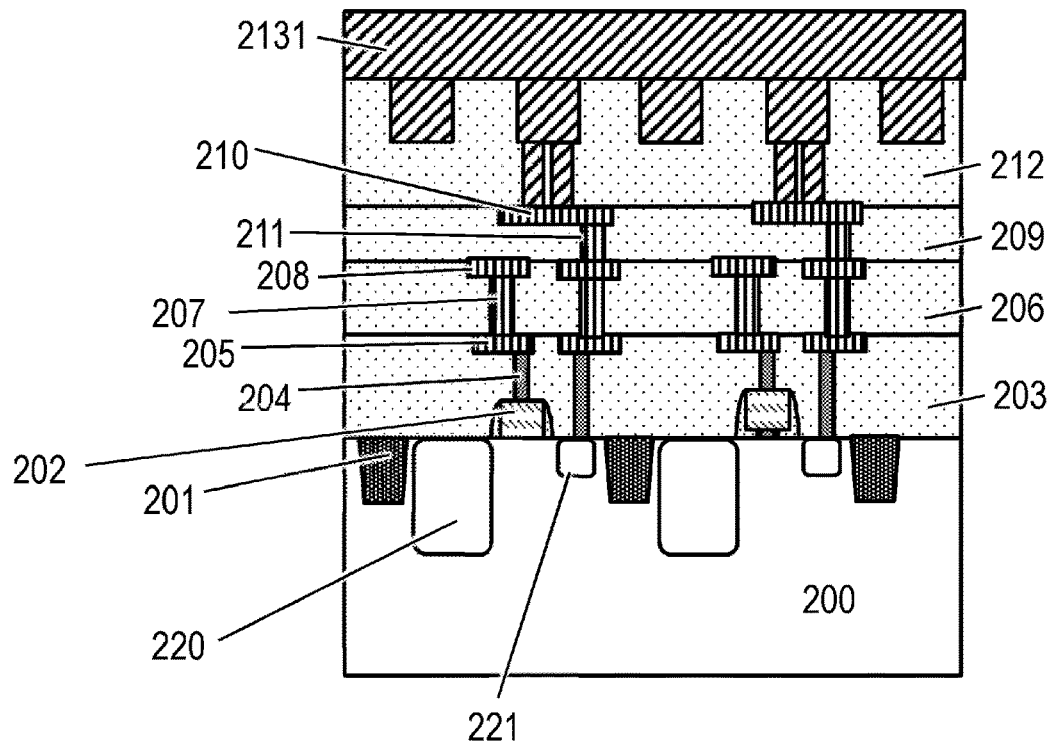
FIGS. 9A and 9B are views showing steps for manufacturing the component according to the first embodiment.

Then, as shown in FIG. 9A, an electric conductor material 2131 is formed over the entire area of the surface of the insulation film 212. At this time, the recessed portions 2130 are embedded with the electric conductor material 2131. The material of the electric conductor material 2131 can be copper.

S2005

Figure 9B:
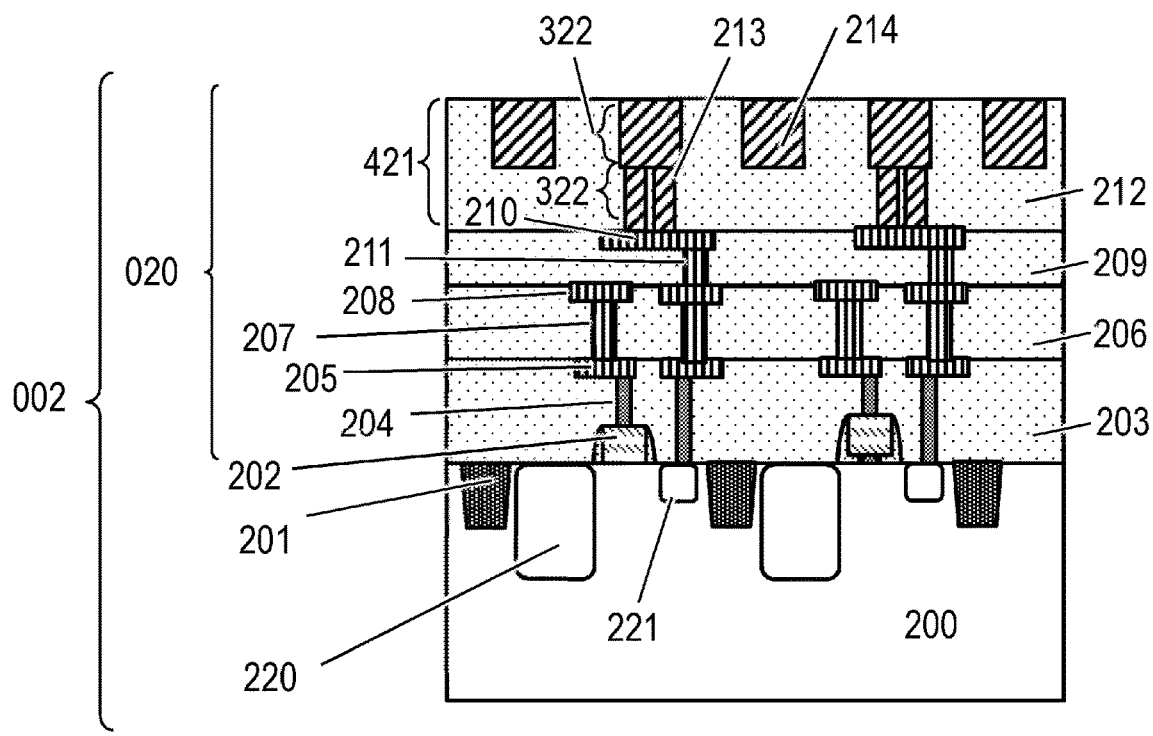

Next, as shown in FIG. 9B, an unnecessary portion of the electric conductor material 2131 is removed by chemical mechanical polishing to form the electric conductor portions 213 connected to the wiring layer 210. That is, the pads 321 and the vias 322 arranged at the bottoms of the pads 321 are formed. If the adjustment of the thicknesses and volumes of the grooves 2321 and the holes 2322 in the recessed portions 2130 has been performed in S2003, the electric conductor portions 213 satisfying the above excellent bonding conditions may be formed. Through the above manufacturing steps, the semiconductor wafer for the component 002 before bonding is completed. Note that since the recessed portions 2130 are formed at an appropriate density in the entire chip during the chemical mechanical polishing, dishing or erosion due to the chemical mechanical polishing is prevented. Accordingly, the flatness of the surface of the semiconductor wafer for the component 002 before bonding is increased. The topmost surface of the semiconductor wafer for the component 002 is flattened and can be constituted by the electric conductor portions 213 and the insulation film 212. That is, a distance from the topmost surface of the semiconductor wafer for the component 002 to the electric conductor portions 213 and the insulation film 212 can be zero. However, until the bonding that will be described later is performed, the semiconductor wafer may be stored or shipped in a state in which a coating film for coating the electric conductor portions 213 and the insulation film 212 is formed. The coating film may have a thickness smaller than that of the pads 321, and have, for example, a thickness of not more than 500 nm, a thickness of not more than 50 nm, or a thickness of at least 5 nm. The thickness of the coating film can correspond to the distance from the topmost surface of the semiconductor wafer for the component 002 to the electric conductor portions 213 and the insulation film 212. The distance from the topmost surface of the semiconductor wafer for the component 002 to the electric conductor portions 213 and the insulation film 212 may be smaller than the thickness of the pads 321 and is, for example, not more than 500 nm, not more than 50 nm, or at least 5 nm.

Manufacturing of Semiconductor Apparatus APR

Figure 5C:
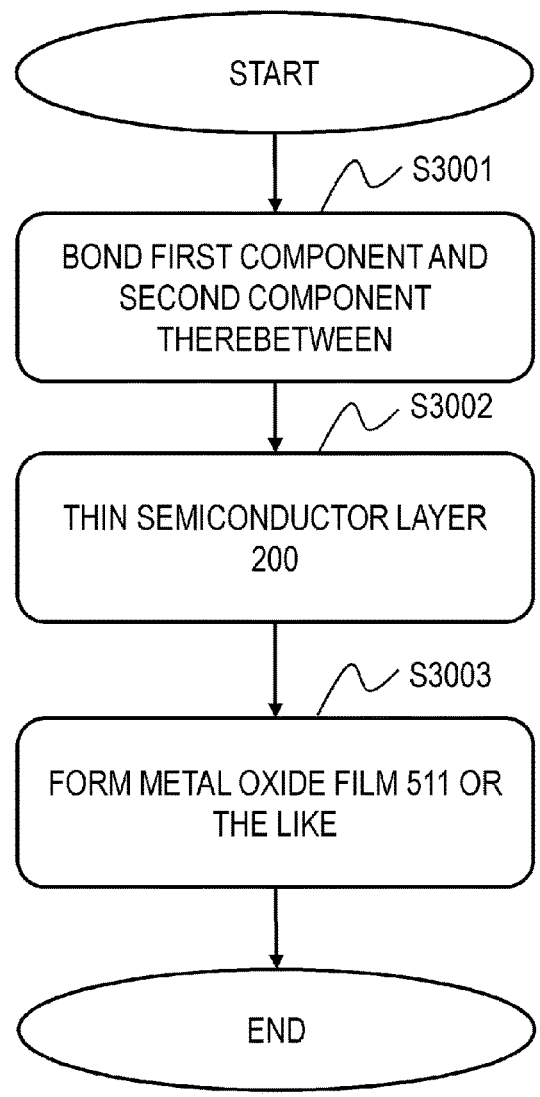

Finally, the method for manufacturing the semiconductor apparatus APR will be described using a flowchart shown in FIG. 5C and FIG. 10.

S3001

Figure 10:
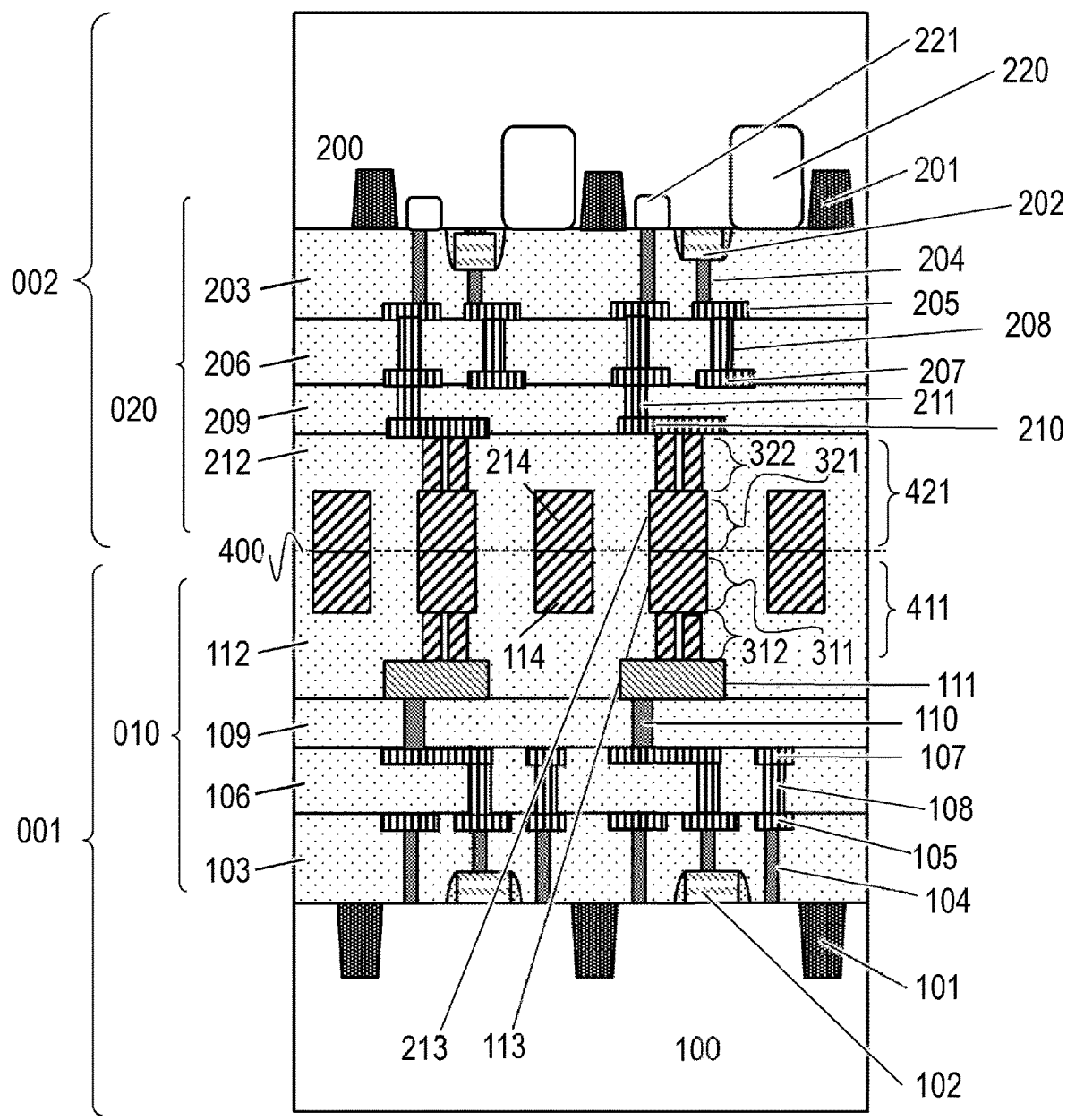
FIG. 10 is a view showing a step for manufacturing the semiconductor apparatus according to the first embodiment.

As shown in FIG. 10, the semiconductor wafer for the component 002 is inverted, and the semiconductor wafer for the component 001 and the semiconductor wafer for the component 002 are bonded to each other at a bonding surface 400. Thus, after the bonding, a structure in which the semiconductor wafer for the component 002 is stacked on the semiconductor wafer for the component 001 is obtained. For example, in the bonding of the wafers, the semiconductor wafers are tentatively bonded to each other by a method in which the insulation films 112 and 212 serving as the bonding surfaces of the wafers are first activated by plasma activation and the activated insulation films 112 and 212 are bonded to each other. After that, thermal treatment is, for example, performed at 350° C., whereby the insulation film 112 and the insulation film 212 are more firmly bonded to each other at the bonding surface 400 compared with the tentative bonding. Further, the electric conductor portions 113 and the electric conductor portions 213 are bonded to each other by the mutual dispersion of copper between the electric conductor portions 113 and the electric conductor portions 213.

Here, as for at least one of the semiconductor wafer for the component 001 and the semiconductor wafer for the component 002, the above relationship between the pad and the vias is set to satisfy excellent bonding conditions. Thus, the separation of the semiconductor wafer for the component 001 and the semiconductor wafer for the component 002 at a bonding interface due to the influence of the thermal expansion of the electric conductor portions 113 or the electric conductor portions 213 may be prevented during the thermal treatment for firmly bonding the semiconductor wafer for the component 001 and the semiconductor wafer for the component 002 to each other. Accordingly, manufacturing yields of the semiconductor apparatus may be increased. Further, the separation of the component 001 and the component 002 at the bonding interface may be prevented. Accordingly, the reliability of the bonding of the components of the semiconductor apparatus may be increased.

S3002

Next, as shown in FIG. 2, the semiconductor layer 200 is thinned to have a thickness of about several tens to several micrometers. As a method for performing the thinning, backgrinding, chemical machine polishing, etching, or the like is used.

S3003

Then, a metal oxide film 511, an anti-reflection film 512, and an insulation film 513 are formed on the surface of the semiconductor layer 200 of the semiconductor wafer for the component 002. The metal oxide film 511 is, for example, a hafnium oxide film, an aluminum oxide film, or the like. The anti-reflection film 512 is, for example, a tantalum oxide film, or the like. The insulation film 513 can arbitrarily be selected from among materials generally used in the semiconductor apparatus. For example, a silicon oxide film, a silicon nitride film, a silicon oxynitriding film, a carbon-containing silicon oxide film, a fluorine-containing silicon oxide film, or the like is selected as a material. Further, the insulation film 513 may have, as its film-layer configuration, a single-layer configuration made of one type of material or a stacked-layer configuration made of a plurality of materials. Further, although not shown in the figures, the insulation film 513 may contain a light-shielding film for forming an OB region made of a metal film such as tungsten or a light-shielding wall for separation to prevent the color mixture of the light of each pixel. Note that a color filter 514 or micro lenses 515 may be formed on the semiconductor layer 200. The semiconductor layer 200 may have openings (pad openings) reaching pad electrodes contained in a wiring structure 010 or a wiring structure 020. Further, the semiconductor layer 100 may have through-silicon vias (TSV) that pass through the semiconductor layer 100 and are connected to electrodes contained in the wiring structure 010 or the wiring structure 020.

After that, the stacked body of the two semiconductor wafers bonded to each other via the electric conductor portions 113 and the electric conductor portions 213 is diced to be separated into a plurality of semiconductor devices IC. In the separated semiconductor devices IC, the component 001 serving as a chip obtained from the semiconductor wafer for the component 001 and the component 002 serving as a chip obtained from the semiconductor wafer for the component 002 are stacked on each other (bonded to each other). Note that although the semiconductor apparatus APR in which the two components of the component 001 and the component 002 are stacked on each other (bonded to each other) is described in the present embodiment, a semiconductor apparatus in which at least three components are stacked one each other (bonded to each other) may be used. In this case as well, respective components (semiconductor components) are bonded to each other by electric conductor portions and insulation films, and the reliability of bonding portions may be increased by the application of the above excellent bonding conditions to the electric conductor portions. Further, although the embodiment in which the wafers are diced after the bonding is performed at a wafer level is described, the chips may be bonded to each other after each of the wafers is diced to obtain the chips.

Equipment EQP

Hereinafter, the equipment EQP including the semiconductor apparatus APR shown in FIG. 1 will be described in detail. As described above, the semiconductor apparatus APR may contain, besides the semiconductor device IC having the semiconductor layer 100, the package PKG for accommodating the semiconductor device IC. The package PKG may contain a base member to which the semiconductor device IC is fixed, a lid member such as glass that faces the semiconductor device IC, and bonding members such as bonding wires and bumps that connect terminals provided in the base member and terminals provided in the semiconductor device IC to each other.

The equipment EQP may include at least any of the optical system OPT, the controller CTRL, the processor PRCS, the display DSPL, the memory MMRY, and the machine MCHN. The optical system OPT forms an image on the semiconductor apparatus APR. The optical system OPT is, for example, a lens, a shutter, or a mirror. The controller CTRL controls the semiconductor apparatus APR. The controller CTRL is, for example, a photoelectric converter such as an ASIC.

The processor PRCS processes a signal output from the semiconductor apparatus APR. The processor PRCS is a photoelectric converter such as a CPU and an ASIC to constitute an analog front end (AFE) or a digital front end (DFE). The display DSPL is an EL display or a liquid crystal display that displays information (image) obtained by the semiconductor apparatus APR. The memory MMRY is an electromagnetic device or a semiconductor device that stores information (image) obtained by the semiconductor apparatus APR. The memory MMRY is a volatile memory such as a SRAM and a DRAM or a non-volatile memory such as a flash memory and a hard disk drive.

The machine MCHN has a movable portion or a propelling portion such as a motor and an engine. A signal output from the semiconductor apparatus APR is displayed on the display DSPL in the equipment EQP or transmitted to an outside by a communication apparatus (not shown) provided in the equipment EQP. Therefore, the equipment EQP preferably further includes the memory MMRY or the processor PRCS, besides a storage circuit or a computation circuit provided in the semiconductor apparatus APR. The machine MCHN may be controlled on the basis of a signal output from the semiconductor apparatus APR.

Further, the equipment EQP is suitable for electronic equipment such as an information terminal (for example, a smart phone or a wearable terminal) having a photographing function and a camera (for example, a lens replaceable camera, a compact camera, a video camera, or a monitoring camera). The machine MCHN in a camera is capable of driving a component of the optical system OPT to perform zooming, focusing, and a shuttering operation.

Further, the equipment EQP can be transportation equipment such as a vehicle, a ship, and an airplane. The machine MCHN in transportation equipment can be used as a moving apparatus. The equipment EQP serving as transportation equipment is preferably suitable for equipment that transports the semiconductor apparatus APR or equipment that assists and/or automatizes driving (steering) with a photographing function. The processor PRCS that assists and/or automatizes driving (steering) is capable of performing processing to operate the machine MCHN serving as a moving apparatus on the basis of information obtained by the semiconductor apparatus APR. Alternatively, the equipment EQP may be medical equipment such as an endoscope, measurement equipment such as a ranging sensor, analysis equipment such as an electronic microscope, or office equipment such as a copier.

The embodiment described above is appropriately modifiable without departing from its technical spirit. Note that the disclosed content of the embodiment is not limited to the one explicitly described in the preset specification but includes all matters comprehensible from the present specification and the drawings attached to the present specification.

Effects

According to the present embodiment, the separation of the component 001 and the component 002 at the bonding interface due to the influence of the thermal expansion of the electric conductor portions may be prevented at the time of thermal treatment for bonding, thermal treatment after bonding, and a temperature rise during use. Accordingly, the reliability of the bonding of the plurality of components in the semiconductor apparatus may be increased.

Accordingly, the use of the semiconductor apparatus according to the present embodiment makes it possible to achieve high efficiency. Therefore, excellent reliability may be obtained, for example, when the semiconductor apparatus is installed in transportation equipment to photograph the outside of the transportation equipment or measure an outside environment. As a result, it is advantageous that the semiconductor apparatus according to the present embodiment is determined to be installed in transportation equipment to manufacture and sell the transportation equipment in terms of improving the performance of the transportation equipment itself.

Second Embodiment

Figure 11:
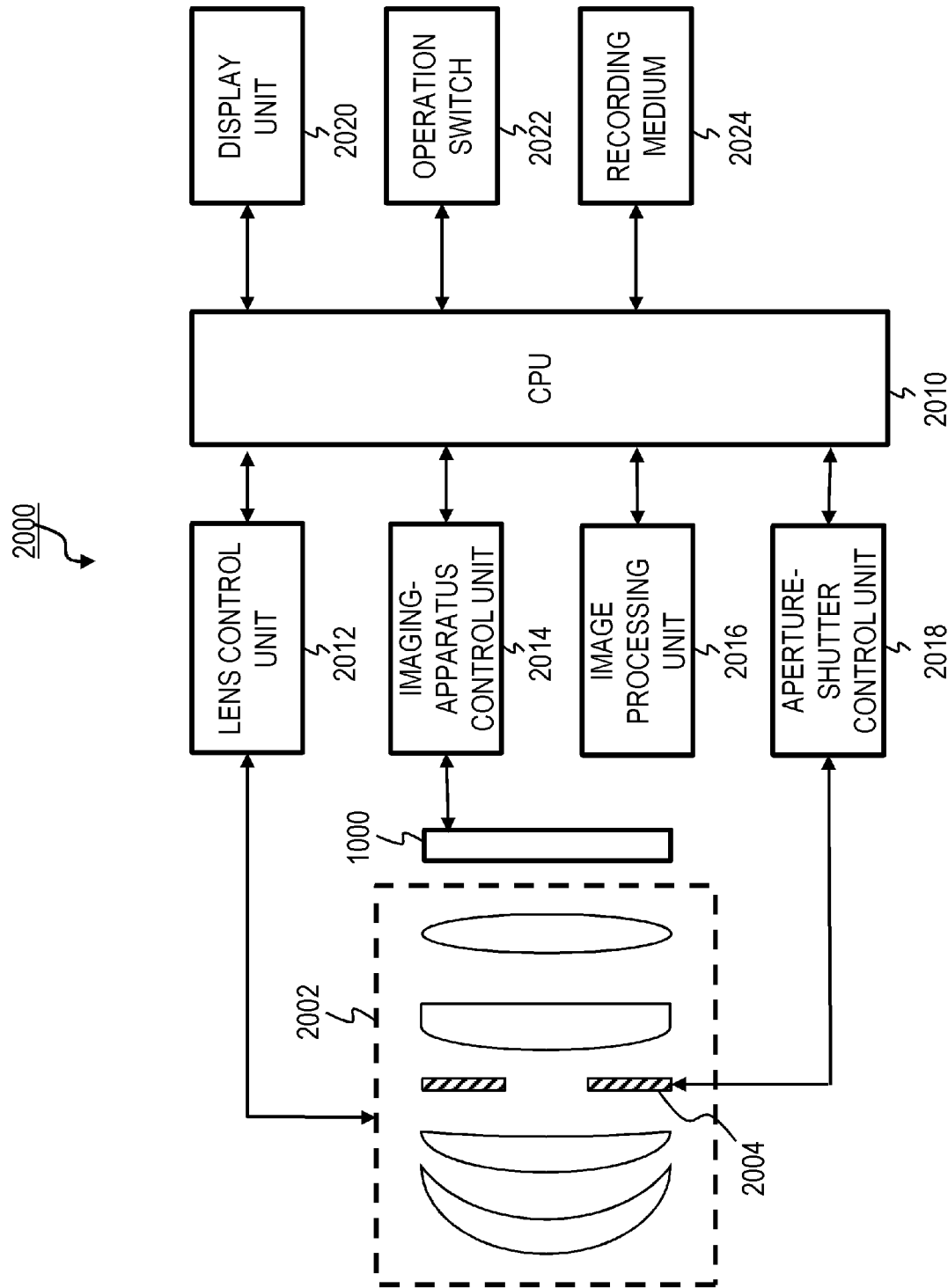
FIG. 11 is a diagram showing a configuration example of an imaging system according to a second embodiment.

An imaging system according to a second embodiment of the present technology will be described with reference to FIG. 11. FIG. 11 is a block diagram showing the schematic configuration of the imaging system according to the present embodiment.

The semiconductor apparatus APR (imaging apparatus) described in the above first embodiment is applicable to various imaging systems. Examples of imaging systems to which the semiconductor apparatus APR is applicable are not particularly limited but can include various equipment such as digital still cameras, digital cam coders, monitoring cameras, copiers, facsimile machines, mobile phones, in-vehicle cameras, observation satellites, and medical cameras. Further, the imaging systems also include camera modules including optical systems such as lenses and imaging apparatuses (photoelectric converters). FIG. 11 shows a block diagram of a digital still camera as an example.

As shown in FIG. 11, an imaging system 2000 includes an imaging apparatus 1000, an imaging optical system 2002, a CPU 2010, a lens control unit 2012, an imaging-apparatus control unit 2014, and an image processing unit 2016. Further, the imaging system 2000 includes an aperture-shutter control unit 2018, a display unit 2020, an operation switch 2022, and a recording medium 2024.

The imaging optical system 2002 is an optical system for forming an optical image of a subject and includes a lens group, an aperture 2004, or the like. The aperture 2004 has, besides the function of adjusting its opening diameter to adjust a light amount during photographing, a function as an exposure time adjustment shutter during the photographing of a static image. The lens group and the aperture 2004 are retained to be advanceable and retractable along a light-axis direction and realize a magnification-change function (zoom function) or a focal-point adjustment function with their coupled operations. The imaging optical system 2002 may be integrated with the imaging system, or it may be an imaging lens capable of being attached to the imaging system.

In the image space of the imaging optical system 2002, the imaging apparatus 1000 is arranged so as to position its imaging surface. The imaging apparatus 1000 is the semiconductor apparatus APR described in the first embodiment and constituted by CMOS sensors (pixel units) and their peripheral circuits (peripheral circuit regions). In the imaging apparatus 1000, pixels having a plurality of photoelectric conversion units are two-dimensionally arranged, and color filters are arranged with respect to the pixels to constitute a two-dimensional single-plate color sensor. The imaging apparatus 1000 photoelectrically converts a subject image formed by the imaging optical system 2002 and outputs the photoelectrically-converted subject image as an image signal or a focal-point detection signal.

The lens control unit 2012 is used to control the advancing/retracting driving of the lens group of the imaging optical system 2002 to perform a magnification-change operation or focal-point adjustment and constituted by circuits or a processor configured to realize the function. The aperture-shutter control unit 2018 is used to change an opening diameter of the aperture 2004 (vary an aperture value) to adjust a photographing light amount and constituted by circuits or a processor configured to realize the function.

The CPU 2010 is a controller inside a camera responsible for performing the various control of a camera body and includes a computation unit, a ROM, a RAM, an A/D converter, a D/A converter, a communication interface circuit, or the like. The CPU 2010 controls the operation of each unit inside the camera according to a computer program stored in the ROM or the like and performs a series of photographing operations such as AF, imaging, image processing, and recording, including detection of the focal-point state (focal-point detection) of the imaging optical system 2002. The CPU 2010 is also a signal processing unit.

The imaging-apparatus control unit 2014 is used to, while controlling the operation of the imaging apparatus 1000, transmit a signal output from the imaging apparatus 1000 to the CPU 2010 after performing A/D conversion on the signal, and constituted by circuits or a controller configured to realize the functions. The A/D conversion function may be provided in the imaging apparatus 1000. The image processing unit 2016 is a processor that performs image processing such as γ-conversion and color interpolation on a A/D-converted signal to generate an image signal, and it is constituted by circuits or a controller configured to realize the function. The display unit 2020 is a display such as a liquid-crystal display (LCD) and displays information on a photographing mode of the camera, a preview image before photographing, a confirmation image after photographing, a focusing state during the detection of a focal point, or the like. The operation switch 2022 is constituted by a power-supply switch, a release (photographing trigger) switch, a zoom operation switch, a photographing-mode selection switch, or the like. The recording medium 2024 is used to record a photographed image or the like. The recording medium 2024 may be a recording medium incorporated in the imaging system or a recording medium such as a memory card that is detachable.

By configuring the imaging system 2000 to which the semiconductor apparatus APR according to the first embodiment is applied as described above, it is possible to realize a high-efficiency imaging system.

Third Embodiment

Figure 12A:
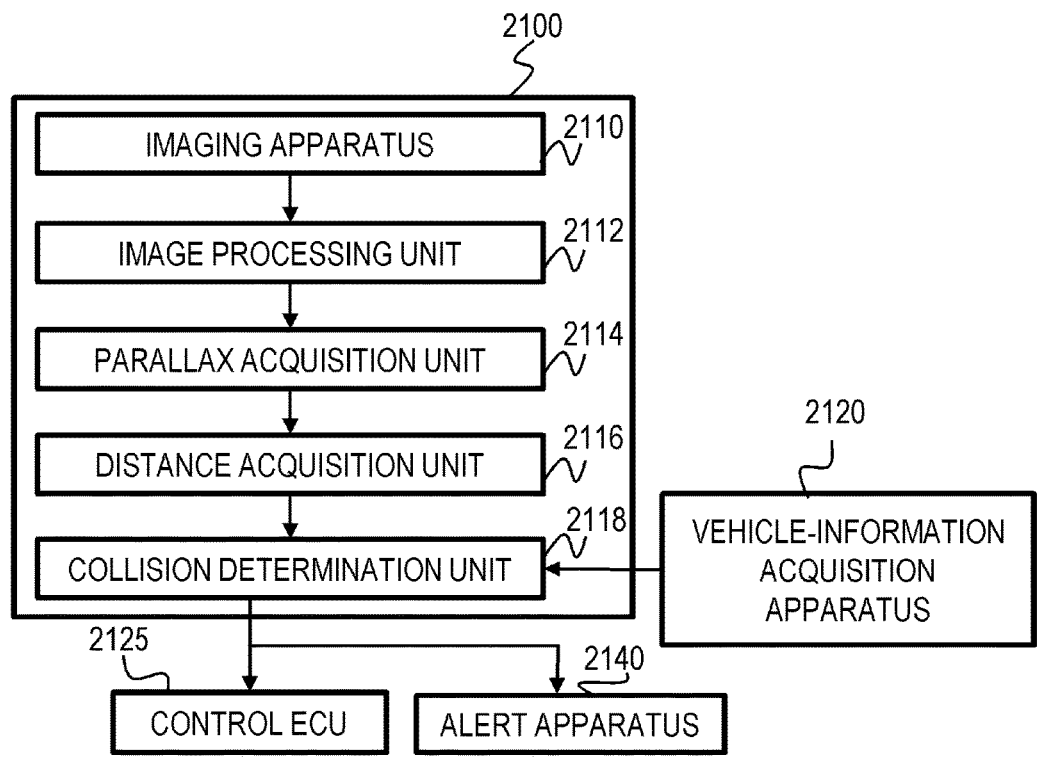
FIG. 12A is a diagram showing a configuration example of an imaging system according to a third embodiment.
Figure 12B:
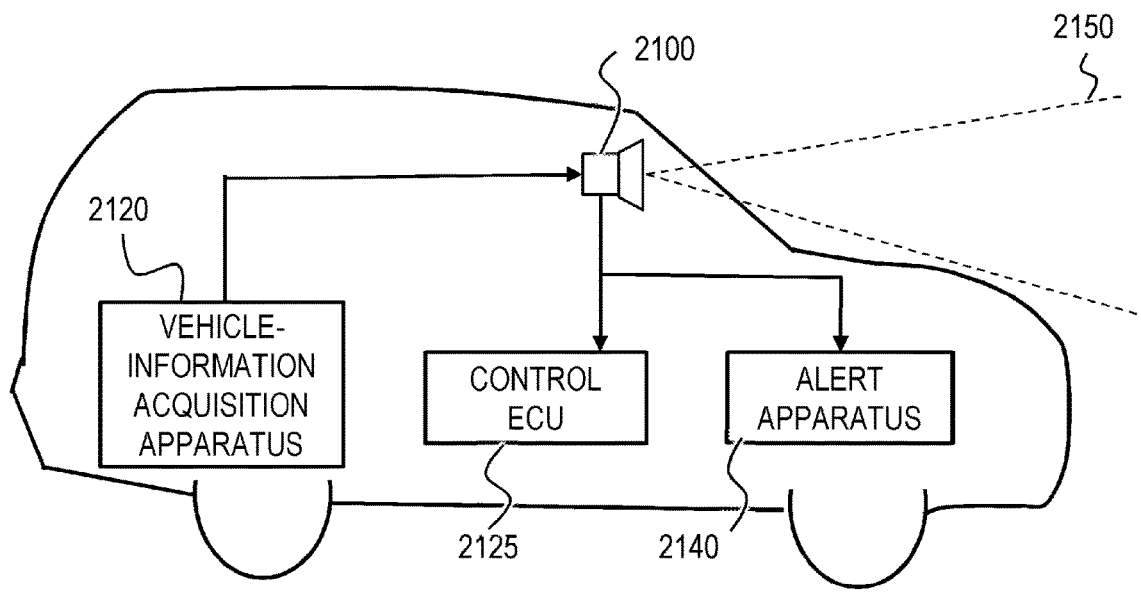
FIG. 12B is a diagram showing a configuration example of a movable body according to the third embodiment.

An imaging system and a movable body according to a third embodiment of the present technology will be described with reference to FIGS. 12A and 12B. FIGS. 12A and 12B are diagrams showing the configurations of the imaging system and the movable body according to the present embodiment.

FIG. 12A shows an example of an imaging system 2100 related to an in-vehicle camera. The imaging system 2100 has an imaging apparatus 2110. The imaging apparatus 2110 is the semiconductor apparatus APR described in the above first embodiment. The imaging system 2100 has an image processing unit 2112 that is a processor to perform image processing on a plurality of image data acquired by the imaging apparatus 2110. The imaging system 2100 has a parallax acquisition unit 2114 that is a processor to calculate parallax (a phase difference of a parallax image) from a plurality of image data acquired by the imaging apparatus 2110. Further, the imaging system 2100 has a distance acquisition unit 2116 that is a processor to calculate a distance to an object on the basis of calculated parallax. The imaging system 2100 has a collision determination unit 2118 that is a processor to determine a collision possibility on the basis of a calculated distance. Here, the parallax acquisition unit 2114 or the distance acquisition unit 2116 is an example of information acquisition means for acquiring information such as information on a distance to an object. That is, the distance information is information on parallax, a defocus amount, a distance to an object, or the like. The collision determination unit 2118 may determine a collision possibility using any of these distance information items. The above processors may be realized by exclusively-designed hardware or general-purpose hardware that performs computation on the basis of a software module. Further, the processors may be realized by field-programmable gate arrays (FPGAs), application-specific integrated circuits (ASICs), or the like. Further, the processors may be realized by the combination of these circuits.

The imaging system 2100 is connected to a vehicle-information acquisition apparatus 2120 and capable of acquiring vehicle information such as a vehicle speed, a yaw rate, and a steering angle. Further, the imaging system 2100 is connected to a control ECU 2125 that is a controller to output a control signal for generating a braking force with respect to a vehicle on the basis of a determination result by the collision determination unit 2118. That is, the control ECU 2125 is an example of movable-body control means for controlling a movable body on the basis of distance information. Further, the imaging system 2100 is also connected to an alert apparatus 2140 that issues an alert to a driver on the basis of a determination result by the collision determination unit 2118. For example, when a determination result by the collision determination unit 2118 shows that a collision possibility is high, the control ECU 2125 performs vehicle control to avoid a collision or lessen damage by applying braking, releasing an accelerator, suppressing an engine output, or the like. The alert apparatus 2140 issues an alert to a user by putting out an alert such as sound, displaying alert information on the screen of a car navigation system or the like, transmitting vibrations to a seat belt or a steering, or the like.

In the present embodiment, an image of the surrounding area of the vehicle, for example, a front side or a rear side is captured by the imaging system 2100. FIG. 12B shows the imaging system 2100 in a case in which an image of the front side (imaging range 2150) of the vehicle is captured. The vehicle-information acquisition apparatus 2120 provides an instruction to operate the imaging system 2100 to perform imaging. By using the semiconductor apparatus APR of the above first embodiment as the imaging apparatus 2110, the imaging system 2100 of the present embodiment may increase ranging accuracy.

The above description refers to an example in which the imaging system performs the control of avoiding a collision with other vehicles. However, the imaging system is also applicable to the control of performing automatic driving while following other vehicles, the control of performing automatic driving so as not to deviate from traffic lanes, or the like. In addition, the imaging system is applicable to, for example, movable bodies (transportation equipment) such as ships, airplanes, and industrial robots, besides vehicle such as automobiles. Movable apparatuses in the movable bodies (transportation equipment) are various driving sources such as engines, motors, wheels, and propellers. Moreover, the imaging system is applicable to equipment such as intelligent transport systems (ITS) that widely makes use of object recognition, besides movable bodies.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-015822, filed on Jan. 31, 2019, which is hereby incorporated by reference herein in its entirety.

What is claimed is:

1. A semiconductor apparatus comprising:
a first semiconductor component including a first semiconductor layer and a first insulation film arranged over the first semiconductor layer; and
a second semiconductor component including a second semiconductor layer and a second insulation film arranged over the second semiconductor layer, wherein
the first semiconductor component and the second semiconductor component are bonded to each other by 1) each of a plurality of first electric conductor portions arranged in each of a plurality of recessed portions provided in the first insulation film and 2) each of a plurality of second electric conductor portions arranged in each of a plurality of recessed portions provided in the second insulation film,
each of the plurality of first electric conductor portions is constituted by 1) one pad surrounded by the first insulation film in a first direction along a principal surface of the first semiconductor layer and 2) N (where N is a natural number of at least two) vias bonded to the one pad so as to be positioned between the one pad and the first semiconductor layer in a second direction perpendicular to the principal surface, and
a volume VTR of the one pad and a total volume VTH of the N vias satisfy $$VTR/VTH \geq N.$$

2. The semiconductor apparatus according to claim 1, wherein $N \times VTR/VTH \leq 36$ is satisfied.

3. The semiconductor apparatus according to claim 1, wherein
VTR is 4.1 $\mu m^2$ to 5.1 $\mu m^2$, and
VTH/N is 0.1 $\mu m^2$ to 0.3 $\mu m^2$.

4. The semiconductor apparatus according to claim 1, wherein the vias have a thickness greater than a thickness of the pad.

5. The semiconductor apparatus according to claim 1, wherein
each of the plurality of first electric conductor portions includes 1) a first copper region that constitutes the pad and has copper as a main ingredient thereof, 2) a second copper region that constitutes the vias and has copper as a main ingredient thereof, 3) a first barrier metal portion positioned between the first copper region and the first insulation film, and 4) a second barrier metal portion positioned between the second copper region and the first insulation film,
the first copper region continues into the second copper region, and
the first barrier metal portion continues into the second barrier metal portion.

6. The semiconductor apparatus according to claim 1, wherein the first semiconductor layer is provided with a photodiode.

7. The semiconductor apparatus according to claim 1, wherein the first semiconductor layer is provided with a digital-signal processing circuit.

8. A semiconductor apparatus comprising:
a first semiconductor component including a first semiconductor layer and a first insulation film arranged over the first semiconductor layer; and
a second semiconductor component including a second semiconductor layer and a second insulation film arranged over the second semiconductor layer, wherein
the first semiconductor component and the second semiconductor component are bonded to each other by 1) each of a plurality of first electric conductor portions arranged in each of a plurality of recessed portions provided in the first insulation film and 2) each of a plurality of second electric conductor portions arranged in each of a plurality of recessed portions provided in the second insulation film,
each of the plurality of first electric conductor portions is constituted by 1) one pad surrounded by the first insulation film in a first direction along a principal surface of the first semiconductor layer and 2) N (where N is a natural number of at least two) vias bonded to the one pad so as to be positioned between the one pad and the first semiconductor layer in a second direction perpendicular to the principal surface, and a volume VTR of the one pad and a volume VSH of at least one of the N vias satisfy $VTR/VSH \geq N^2$.

9. A semiconductor apparatus comprising:
a first semiconductor component including a first semiconductor layer and a first insulation film arranged over the first semiconductor layer; and
a second semiconductor component including a second semiconductor layer and a second insulation film arranged over the second semiconductor layer, wherein
the first semiconductor component and the second semiconductor component are bonded to each other by 1) each of a plurality of first electric conductor portions arranged in each of a plurality of recessed portions provided in the first insulation film and 2) each of a plurality of second electric conductor portions arranged in each of a plurality of recessed portions provided in the second insulation film,
each of the plurality of first electric conductor portions is constituted by 1) one pad surrounded by the first insulation film in a first direction along a principal surface of the first semiconductor layer and 2) at least one via bonded to the one pad so as to be positioned between the one pad and the first semiconductor layer in a second direction perpendicular to the principal surface, and
a volume VTR of the one pad and a volume VSH of one via satisfy $VTR/VSH \geq 16$.

10. The semiconductor apparatus according to claim 9, wherein the first semiconductor component and the second semiconductor component are bonded to each other by the first insulation film and the second insulation film.

11. The semiconductor apparatus according to claim 9, wherein
the first insulation layer includes 1) a first silicon oxide layer, 2) a second silicon oxide layer arranged between the first silicon oxide layer and the first semiconductor layer in the second direction, and 3) a silicon nitride layer arranged between the first silicon oxide layer and the second silicon oxide layer in the second direction,
the first silicon oxide layer surrounds the pad in the first direction, and
the second silicon oxide layer surrounds the via in the first direction.

12. The semiconductor apparatus according to claim 11, wherein
the silicon nitride layer includes 1) a first portion surrounding the pad in the first direction, and 2) a second portion positioned between the second silicon oxide layer and the pad in the second direction.

13. The semiconductor apparatus according to claim 12, wherein,
in case where the first portion has a thickness of "b" and the second portion has a thickness of "c",
$c<b$ is satisfied.

14. The semiconductor apparatus according to claim 12, wherein,
in case where the first silicon oxide layer has a thickness of "a", the first portion has a thickness of "b", the second portion has a thickness of "c", and a portion of the second silicon oxide layer that overlaps the pad has a thickness of "d",
$a<b$ and $c<d$ are satisfied.

15. The semiconductor apparatus according to claim 11, wherein,
in case where the first silicon oxide layer has a thickness of "a" and a portion of the second silicon oxide layer that overlaps the pad has a thickness of "d",
$a<d$ is satisfied.

16. The semiconductor apparatus according to claim 9, wherein a wiring layer mainly constituted by aluminum is arranged between the plurality of first electric conductor portions and the first semiconductor layer.

17. The semiconductor apparatus according to claim 9, wherein
each of the plurality of second electric conductor portions is constituted by 1) one pad portion surrounded by the second insulation film in a third direction along a principal surface of the second semiconductor layer and 2) M (where M is a natural number of at least two) vias continuing into the one pad portion so as to be positioned between the one pad and the second semiconductor layer in a fourth direction perpendicular to the principal surface, and
a volume VTRP of the one pad portion and a total volume VTHP of the M vias satisfy $VTRP/VTHP \geq H$.

18. The semiconductor apparatus according to claim 9, wherein $VTR/VSH \leq 36$ is satisfied.

19. The semiconductor apparatus according to claim 9, wherein
VTR is 4.1 $\mu m^2$ to 5.1 $\mu m^2$, and
VSH is 0.1 $\mu m^2$ to 0.3 $\mu m^2$.

20. An apparatus comprising:
the semiconductor apparatus according to claim 9; and
at least any one of the following six components: 1) an optical system configured to form an image on the semiconductor apparatus, 2) a controller configured to control the semiconductor apparatus, 3) a processor configured to process a signal output from the semiconductor apparatus, 4) a display configured to display information obtained by the semiconductor apparatus, 5) a memory configured to store information obtained by the semiconductor apparatus, and 6) a machine having a movable portion or a propelling portion.

* * * * *